(12) United States Patent
Wei et al.

(10) Patent No.: US 7,312,623 B2
(45) Date of Patent: Dec. 25, 2007

(54) WAFER-LEVEL TESTER WITH MAGNET TO TEST LATCHING MICRO-MAGNETIC SWITCHES

(75) Inventors: Cheng Ping Wei, Gilbert, AZ (US); Jun Shen, Phoenix, AZ (US)

(73) Assignee: Schneider Electric Industries SAS (FR)

( * ) Notice: Subject to any disclaimer, the term of this patent is extended or adjusted under 35 U.S.C. 154(b) by 64 days.

(21) Appl. No.: 11/362,281

(22) Filed: Feb. 27, 2006

(65) Prior Publication Data
US 2006/0284629 A1 Dec. 21, 2006

Related U.S. Application Data

(63) Continuation of application No. 10/823,786, filed on Apr. 14, 2004, now Pat. No. 7,005,876.

(60) Provisional application No. 60/462,312, filed on Apr. 14, 2003.

(51) Int. Cl.
*G01R 31/26* (2006.01)
(52) U.S. Cl. ............................ 324/765
(58) Field of Classification Search ............ 324/760, 324/763, 765, 754, 761, 762; 335/78–86, 335/177–183
See application file for complete search history.

(56) References Cited

U.S. PATENT DOCUMENTS

| | | | |
|---|---|---|---|
| 5,420,522 A | * | 5/1995 | Smayling ............... 324/765 |
| 5,838,163 A | | 11/1998 | Rostoker et al. |
| 6,469,602 B2 | | 10/2002 | Ruan et al. |
| 6,731,122 B2 | * | 5/2004 | Feng ............... 324/752 |
| 7,005,876 B2 | | 2/2006 | Wei et al. |

* cited by examiner

*Primary Examiner*—Ha Tran Nguyen
*Assistant Examiner*—Tung X. Nguyen
(74) *Attorney, Agent, or Firm*—Sterne, Kessler, Goldstein & Fox, PLLC.

(57) ABSTRACT

A method, system, and apparatus for testing one or more micro-magnetic switches on a wafer is described. A magnet is positioned adjacent to a first switch on the wafer. A probe card is positioned adjacent to the first switch. The probe card mounts a first set of probes and a second set of probes. The first set of probes interface with contact areas of a coil associated with the first switch. The second set of probes interface with conductors on the wafer associated with the cantilever of the first switch. A current source is electrically coupled to the first set of probes. The current source activates the coil of the first switch using the first set of probes to switch the cantilever from a first state to a second state. A switch state monitor is electrically coupled to the second set of probes. The switch state monitor determines whether the cantilever of the first switch is in the first state prior to the current source activating the coil of the first switch. The switch state monitor also determines whether the cantilever is in the second state after the current source activates the coil of the first switch. A stepper motor moves the wafer relative to the magnet and probe card to test further switches on the wafer. An inker marks a switch on the wafer that has been determined by the switch state monitor to be defective.

11 Claims, 16 Drawing Sheets

1500 (continued)

1518 the wafer is moved so that the magnet is positioned adjacent to a cantilever of another switch located on the wafer, and so that the probe card is positioned adjacent to the another switch

1520 steps 1506-1516 are repeated for the another switch

1522 steps 1518 and 1520 are repeated for each switch of a plurality of switches on the wafer

FIG. 15B

WAFER-LEVEL TESTER WITH MAGNET TO TEST LATCHING MICRO-MAGNETIC SWITCHES

CROSS-REFERENCE TO RELATED APPLICATIONS

This application claims the benefit of U.S. Provisional Application No. 60/462,312, filed Apr. 14, 2003, and continuation of the application No. 10/823,786 filed on Apr. 14, 2004 now U.S. Pat. No. 7,005,876 which is herein incorporated by reference in its entirety.

BACKGROUND OF THE INVENTION

1. Field of the Invention

The present invention relates to testing of electronic switches. More specifically, the present invention relates to the testing of a plurality of micro-magnetic switches on a wafer.

2. Background Art

Switches are typically electrically controlled two-state devices that open and close contacts to effect operation of devices in an electrical or optical circuit. Relays, for example, typically function as switches that activate or de-activate portions of electrical, optical or other devices. Relays are commonly used in many applications including telecommunications, radio frequency (RF) communications, portable electronics, consumer and industrial electronics, aerospace, and other systems. More recently, optical switches (also referred to as "optical relays" or simply "relays" herein) have been used to switch optical signals (such as those in optical communication systems) from one path to another.

Although the earliest relays were mechanical or solid-state devices, recent developments in micro-electro-mechanical systems (MEMS) technologies and microelectronics manufacturing have made micro-electrostatic and micro-magnetic relays possible. Such micro-magnetic relays typically include an electromagnet that energizes an armature to make or break an electrical contact. When the magnet is de-energized, a spring or other mechanical force typically restores the armature to a quiescent position. Such relays typically exhibit a number of marked disadvantages, however, in that they generally exhibit only a single stable output (i.e., the quiescent state) and they are not latching (i.e., they do not retain a constant output as power is removed from the relay). Moreover, the spring required by conventional micro-magnetic relays may degrade or break over time.

Non-latching micro-magnetic relays are known. The relay includes a permanent magnet and an electromagnet for generating a magnetic field that intermittently opposes the field generated by the permanent magnet. The relay must consume power in the electromagnet to maintain at least one of the output states. Moreover, the power required to generate the opposing field would be significant, thus making the relay less desirable for use in space, portable electronics, and other applications that demand low power consumption.

A bi-stable, latching switch that does not require power to hold the states is therefore desired. Such a switch should also be reliable, simple in design, low-cost and easy to manufacture, and should be useful in optical and/or electrical environments.

Furthermore, to be more commercially viable, latching and non-latching switches should be manufacturable and testable in large quantities. Thus, a low-cost and efficient way of testing the operation of such switches after manufacturing is desirable. In particular, it would be desirable to be able to rapidly test large quantities of the switches.

BRIEF SUMMARY OF THE INVENTION

A method, system, and apparatus for testing one or more micro-magnetic switches on a wafer is described. The switches on the wafer can be of any type, including single pull-single throw (SPST), single pull-double throw (SPDT), double pull-double throw (DPDT), or the like. The wafer can be populated entirely by the same type of switch (e.g., all SPDT), or can be populated by various switch types.

In an aspect of the present invention, a plurality of micro-magnetic switches formed on a wafer are tested. Each switch of the plurality of switches includes a cantilever on the wafer and a coil. A magnet is positioned adjacent to a cantilever of a first switch located on the wafer. The magnet induces a magnetization in a magnetic material of the cantilever. A first set of probes is interfaced with contact areas of the coil of the first switch associated with the cantilever. A second set of probes is interfaced with conductors associated with the cantilever of the same switch. A current is caused to flow through the coil using the first probes to switch the cantilever from a first state to a second state. After causing the current to flow through the coil, the second probes are then used to measure one or more electrical parameters related to the cantilever and conductors in the second state.

For example, a forward current can be caused to flow through the coil using the first probes to switch the cantilever from a known state or from an undetermined state to the first state. After causing the current to flow through the coil, the second probes can then be used to measure resistance or other parameters between the conductors in the first state. A current in a reverse direction relative to the forward current can then be caused to flow throw the coil using the first probes to switch the cantilever from the first state to the second state. The second probes can then be used to measure resistance and/or other parameters related to the cantilever and conductors in the second state.

In a further aspect of the present invention, the wafer is moved to position the magnet adjacent to further switches on the wafer to be tested. The first set of probes is interfaced with contact areas of coils associated with cantilevers of the further switches. The second set of probes is interfaced with conductors associated with the cantilevers of the further switches. The first set of probes is used to switch the further switches between the first and second states and to measure the current through the coil and/or other parameters. The second set of probes is used to measure resistance and/or other parameters related to the cantilevers in the first and second states.

In a still further aspect of the present invention, multiple switches on the wafer can be tested in parallel. Each magnet of a plurality of magnets is positioned adjacent to a corresponding switch on the wafer. A first set of probes corresponding to each switch is interfaced with contact areas of coils associated with cantilevers of the corresponding switch. A second set of probes corresponding to each switch is interfaced with conductors associated with the cantilevers of the corresponding switch. The first sets of probes are used to switch corresponding switches between the first and second states. The second sets of probes are used to measure resistance and/or other parameters related to the cantilevers in the first and second states.

In an aspect of the present invention, an indication is provided that a switch on the wafer has failed or is defective when the cantilever is determined to not be in the first or second state when expected and/or the measured resistance or other parameters are not as expected.

In an aspect of the present invention, the conductors associated with the cantilever include a first conductor and a second conductor. During proper operation in the first state, the cantilever electrically couples the first conductor to the second conductor. Thus, in an aspect of the invention, a first probe of the second set of probes is electrically coupled with the first conductor, and a second probe of the second set of probes is electrically coupled to the second conductor. It is then determined whether the first conductor is electrically coupled to the second conductor.

In a further aspect of the present invention, the conductors associated with the cantilever further include a third conductor and a fourth conductor. During proper operation in second state, the cantilever electrically couples the third conductor to the fourth conductor. Thus, in an aspect of the invention, a third probe of the second set of probes is electrically coupled with the third conductor, and a fourth probe of the second set of probes is electrically coupled with the fourth conductor.

In a further aspect of the present invention, the first set of probes and the second set of probes are mounted to or held by a probe card. Prior to testing of the first switch, the probe card is positioned adjacent to the first switch.

In another aspect of the present invention, a system and apparatus for testing one or more micro-magnetic switches on a wafer is presented. A magnet is positioned adjacent to a first switch on the wafer. A probe card is positioned adjacent to the first switch. The probe card mounts a first set of probes and a second set of probes. The first set of probes interface with contact areas of a coil associated with the first switch. The second set of probes interface with conductors on the wafer associated with the cantilever of the first switch. A current source is electrically coupled to the first set of probes. The current source activates the coil of the first switch using the first set of probes to switch the cantilever from a first state to a second state. Electrical measuring equipment or devices are electrically coupled to the second set of probes. The equipment/devices measure resistance and/or other parameters, and determine whether the cantilever of the first switch switches properly between the first state and second state as expected. One or more stepper motors can move the wafer relative to the magnet and probe card to test further switches on the wafer.

In a further aspect of the present invention, a failed switch marker marks a switch on the wafer that has been determined by the electrically measured resistance and/or other parameters to be defective.

In a further aspect of the present invention, a controller is electrically coupled to the one or more stepper motors, the current source, and the switch state monitor. The controller controls operation of the wafer test system and apparatus.

In a further aspect of the present invention, an optical device is used to initially position the magnet adjacent to the cantilever of the first switch. The magnet is mounted adjacent to the optical device. In an alternative aspect, the magnet has a centrally located opening. The magnet is mounted on the front end of the optical device, or to another mechanism that holds the magnet adjacent to the optical device and switches. The magnet is positioned adjacent to the cantilever of the first switch by viewing the cantilever of the first switch through the opening in the magnet using the optical device.

In a still further aspect of the present invention, multiple switches can be tested simultaneously. One or more additional magnets are held in a fixed position relative to the first magnet. The one or more additional magnets are positioned adjacent to one or more additional switches of the plurality of switches. The probe card further mounts one or more additional first sets of probes that interface with contact areas of one or more additional coils associated with the one or more additional switches on the wafer. One or more additional second sets of probes interface with conductors on the wafer associated with one or more additional cantilevers of the one or more additional switches.

After test, the latching or non-latching micro-magnetic switches can be separated from the wafer, and can be used in a wide range of products including household and industrial appliances, consumer electronics, military hardware, medical devices and vehicles of all types, just to name a few broad categories of goods. The micro-magnetic switch packages of the present invention have the advantages of compactness, simplicity of fabrication, and have good performance at high frequencies.

These and other objects, advantages and features will become readily apparent in view of the following detailed description of the invention.

BRIEF DESCRIPTION OF THE FIGURES

The above and other features and advantages of the present invention are hereinafter described in the following detailed description of illustrative embodiments to be read in conjunction with the accompanying drawing figures, wherein like reference numerals are used to identify the same or similar parts in the similar views.

FIGS. 15A and 15B show a flowchart providing example steps for testing one or more micro-magnetic latching switches on a wafer, according to an embodiment of the present invention.

Figure 1A:
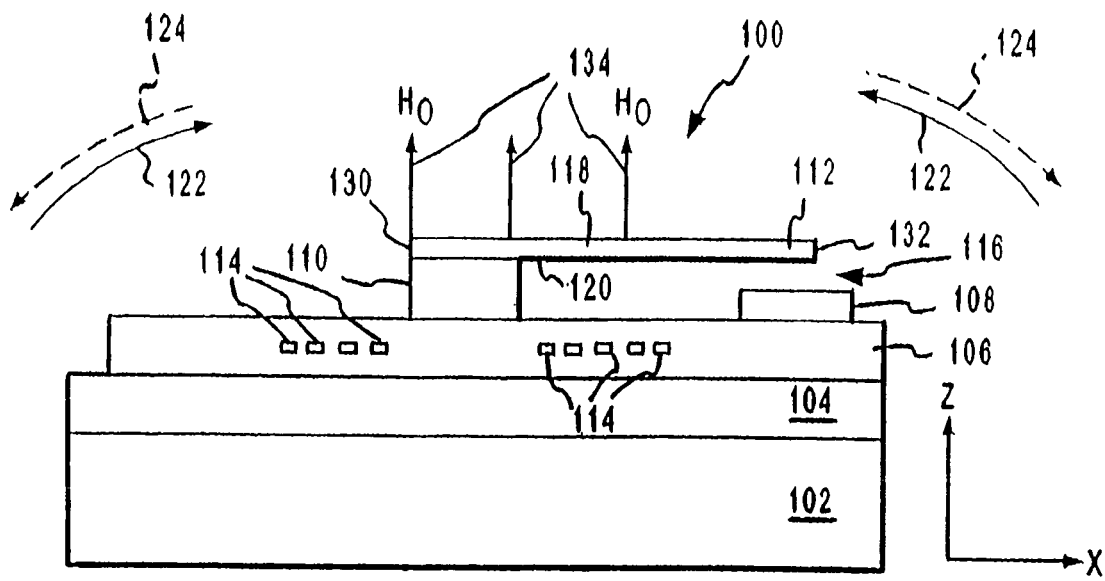
FIGS. 1A and 1B show side and top views, respectively, of an exemplary fixed-end latching micro-magnetic switch, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

It should be appreciated that the particular implementations shown and described herein are examples of the invention and are not intended to otherwise limit the scope of the present invention in any way. Indeed, for the sake of brevity, conventional electronics, manufacturing, MEMS technologies and other functional aspects of the systems (and components of the individual operating components of the systems) may not be described in detail herein. Furthermore, for purposes of brevity, the invention is frequently described herein as pertaining to a micro-electronically-machined relay for use in electrical or electronic systems. It should be appreciated that many other manufacturing techniques could be used to create the relays described herein, and that the techniques described herein could be used in mechanical relays, optical relays or any other switching device. Further, the techniques would be suitable for application in electrical systems, optical systems, consumer electronics, industrial electronics, wireless systems, space applications, or any other application.

The terms, chip, integrated circuit, monolithic device, semiconductor device, and microelectronic device, are often used interchangeably in this field. The present invention is applicable to all the above as they are generally understood in the field.

The terms metal line, transmission line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure, contact and via refer to the completed structure.

The term vertical, as used herein, means substantially orthogonal to the surface of a substrate. Moreover, it should be understood that the spatial descriptions (e.g., "above", "below", "up", "down", "top", "bottom", etc.) made herein are for purposes of illustration only, and that practical latching relays can be spatially arranged in any orientation or manner.

The above-described micro-magnetic latching switch is further described in U.S. Pat. No. 6,469,602 (titled Electronically Switching Latching Micro-magnetic Relay And Method of Operating Same). This patent provides a thorough background on micro-magnetic latching switches and is incorporated herein by reference in its entirety.

An overview of an example latching switch that can be tested according to the present invention is described in the following sections. This is followed by a detailed description of embodiments for testing the operation of micro-magnetic switches.

Overview of a Latching Switch

Figure 1B:
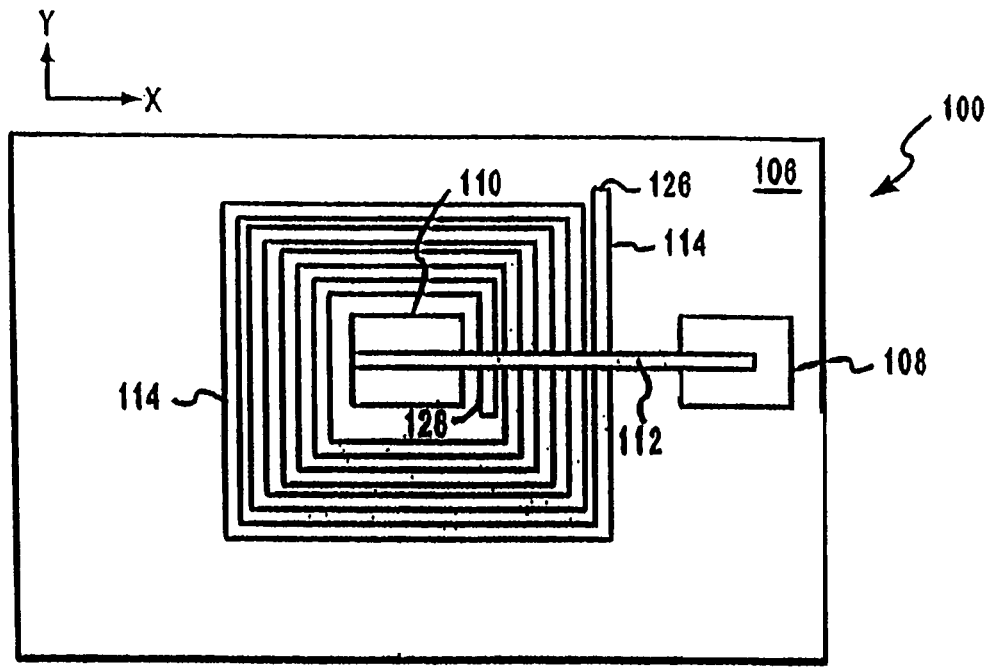

FIGS. 1A and 1B show side and top views, respectively, of a latching switch. The terms switch and device are used herein interchangeably to described the structure of the present invention. With reference to FIGS. 1A and 1B, an exemplary latching relay 100 suitably includes a magnet 102, a substrate 104, an insulating layer 106 housing a conductor 114, a contact 108 and a cantilever (moveable element) 112 positioned or supported above substrate by a staging layer 110.

Magnet 102 is any type of magnet such as a permanent magnet, an electromagnet, or any other type of magnet capable of generating a magnetic field $H_0$ 134, as described more fully below. By way of example and not limitation, the magnet 102 can be a model 59-P09213T001 magnet available from the Dexter Magnetic Technologies corporation of Fremont, Calif., although of course other types of magnets could be used. Magnetic field 134 can be generated in any manner and with any magnitude, such as from about 1 Oersted to $10^4$ Oersted or more. The strength of the field depends on the force required to hold the cantilever in a given state, and thus is implementation dependent. In the exemplary embodiment shown in FIG. 1A, magnetic field $H_0$ 134 can be generated approximately parallel to the Z axis and with a magnitude on the order of about 370 Oersted, although other embodiments will use varying orientations and magnitudes for magnetic field 134. In various embodiments, a single magnet 102 can be used in conjunction with a number of relays 100 sharing a common substrate 104.

Substrate 104 is formed of any type of substrate material such as silicon, gallium arsenide, glass, plastic, metal or any other substrate material. In various embodiments, substrate 104 can be coated with an insulating material (such as an oxide) and planarized or otherwise made flat. In various embodiments, a number of latching relays 100 can share a single substrate 104. Alternatively, other devices (such as transistors, diodes, or other electronic devices) could be formed upon substrate 104 along with one or more relays 100 using, for example, conventional integrated circuit manufacturing techniques. Alternatively, magnet 102 could be used as a substrate and the additional components discussed below could be formed directly on magnet 102. In such embodiments, a separate substrate 104 may not be required.

Insulating layer 106 is formed of any material such as oxide or another insulator such as a thin-film insulator. In an exemplary embodiment, insulating layer is formed of Probimide 7510 material. Insulating layer 106 suitably houses conductor 114. Conductor 114 is shown in FIGS. 1A and 1B to be a single conductor having two ends 126 and 128 arranged in a coil pattern. Alternate embodiments of conductor 114 use single or multiple conducting segments arranged in any suitable pattern such as a meander pattern, a serpentine pattern, a random pattern, or any other pattern. Conductor 114 is formed of any material capable of conducting electricity such as gold, silver, copper, aluminum, metal or the like. As conductor 114 conducts electricity, a magnetic field is generated around conductor 114 as discussed more fully below.

Cantilever (moveable element) 112 is any armature, extension, outcropping or member that is capable of being affected by magnetic force. In the embodiment shown in FIG. 1A, cantilever 112 suitably includes a magnetic layer 118 and a conducting layer 120. Magnetic layer 118 can be formulated of permalloy (such as NiFe alloy) or any other magnetically sensitive material. Conducting layer 120 can be formulated of gold, silver, copper, aluminum, metal or any other conducting material. In various embodiments, cantilever 112 exhibits two states corresponding to whether relay 100 is "open" or "closed", as described more fully below. In many embodiments, relay 100 is said to be "closed" when a conducting layer 120, connects staging layer 110 to contact 108. Conversely, the relay may be said to be "open" when cantilever 112 is not in electrical contact with contact 108. Because cantilever 112 can physically move in and out of contact with contact 108, various embodiments of cantilever 112 will be made flexible so that cantilever 112 can bend as appropriate. Flexibility can be created by varying the thickness of the cantilever (or its various component layers), by patterning or otherwise making holes or cuts in the cantilever, or by using increasingly flexible materials.

Although the dimensions of cantilever 112 can vary dramatically from implementation to implementation, an exemplary cantilever 112 suitable for use in a micro-magnetic relay 100 can be on the order of 10-1000 microns in length, 1-40 microns in thickness, and 2-600 microns in width. For example, an exemplary cantilever in accordance with the embodiment shown in FIGS. 1A and 1B can have dimensions of about 600 microns ×10 microns ×50 microns, or 1000 microns ×600 microns ×25 microns, or any other suitable dimensions.

Contact 108 and staging layer 110 are placed on insulating layer 106, as appropriate. In various embodiments, staging layer 110 supports cantilever 112 above insulating layer 106, creating a gap 116 that can be vacuum or can become filled with air or another gas or liquid such as oil. Although the size of gap 116 varies widely with different implementations, an exemplary gap 116 can be on the order of 1-100 microns, such as about 20 microns, Contact 108 can receive cantilever 112 when relay 100 is in a closed state, as described below. Contact 108 and staging layer 110 can be formed of any conducting material such as gold, gold alloy, silver, copper, aluminum, metal or the like. In various embodiments, contact 108 and staging layer 110 are formed of similar conducting materials, and the relay is considered to be "closed" when cantilever 112 completes a circuit between staging layer 110 and contact 108. In certain embodiments wherein cantilever 112 does not conduct electricity, staging layer 110 can be formulated of non-conducting material such as Probimide material, oxide, or any other material. Additionally, alternate embodiments may not require staging layer 110 if cantilever 112 is otherwise supported above insulating layer 106.

Figure 1C:
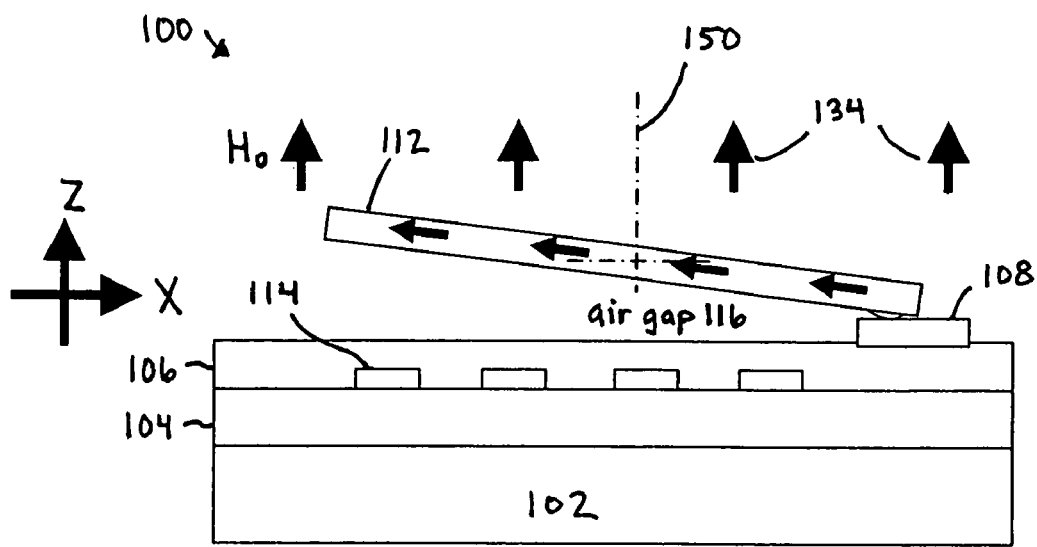
FIGS. 1C and 1D show side and top views, respectively, of an exemplary hinged latching micro-magnetic switch, according to an embodiment of the present invention.
Figure 1D:
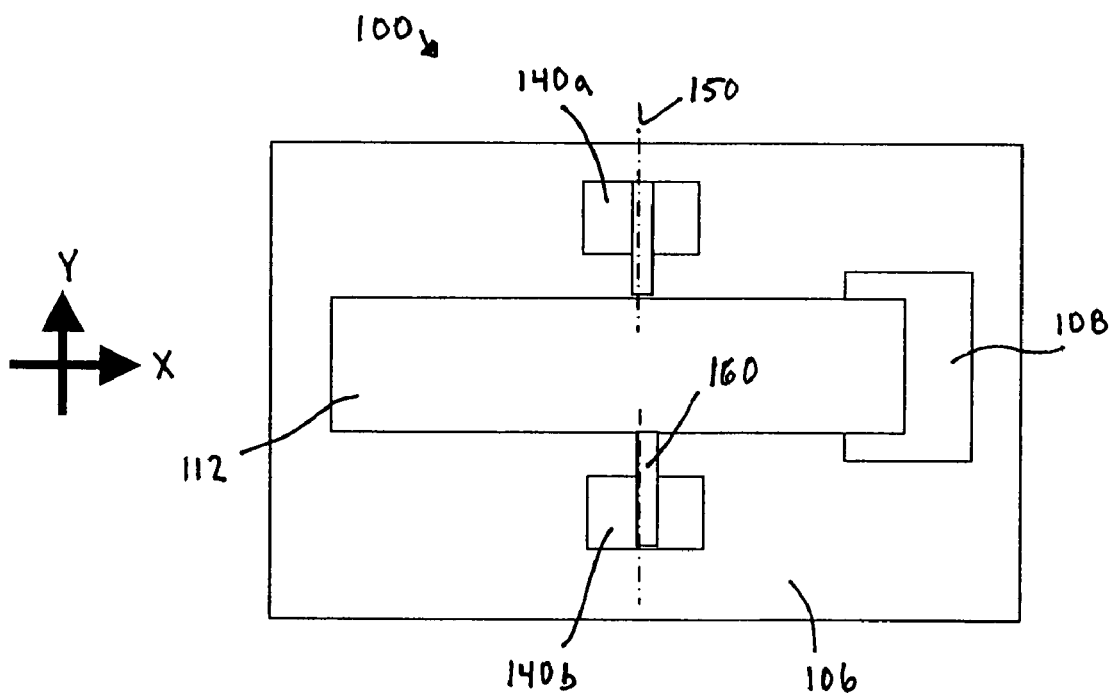

Alternatively, cantilever 112 can be made into a "hinged" arrangement. For example, FIGS. 1C and 1D show side and top views, respectively, of a latching relay 100 incorporating a hinge 160, according to an embodiment of the present invention. Hinge 160 centrally attaches cantilever 112, in contrast to staging layer 110, which attaches an end of cantilever 112. Hinge 160 is supported on first and second hinge supports 140a and 140b. Latching relay 100 shown in FIGS. 1C and 1D operates substantially similarly to the switch embodiment shown in FIGS. 1A and 1D, except that cantilever 112 flexes or rotates around hinge 160 when changing states. Indicator line 150 shown in FIG. 1C indicates a central axis of cantilever 112 around which cantilever 112 rotates. Hinge 160 and hinge supports 140a and 140b can be made from electrically or non-electrically conductive materials, similarly to staging layer 110. Relay 100 is considered to be "closed" when cantilever 112 completes a circuit between one or both of first and second hinge supports 140a and 104b, and contact 108.

Figure 1E:
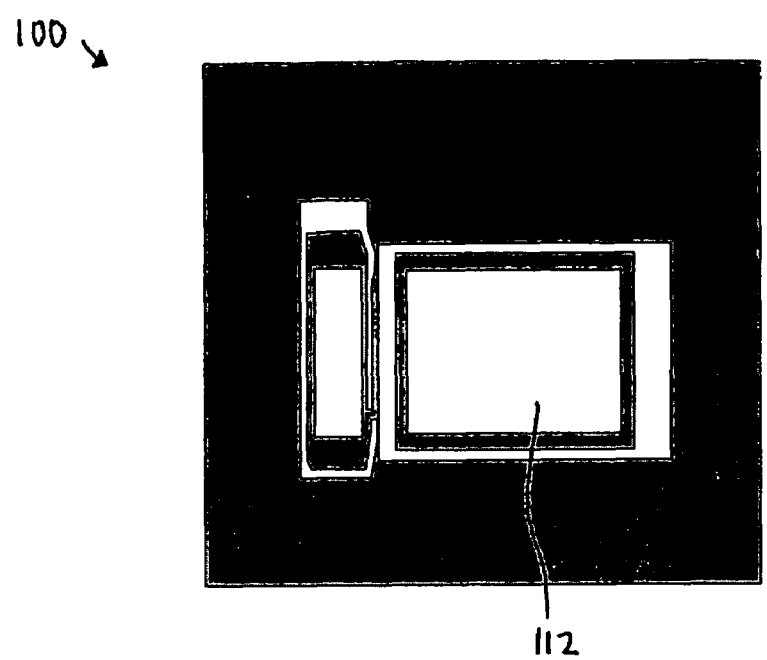
FIG. 1E shows an example implementation of the switch of FIGS. 1A and 1B, according to an embodiment of the present invention.
Figure 1F:
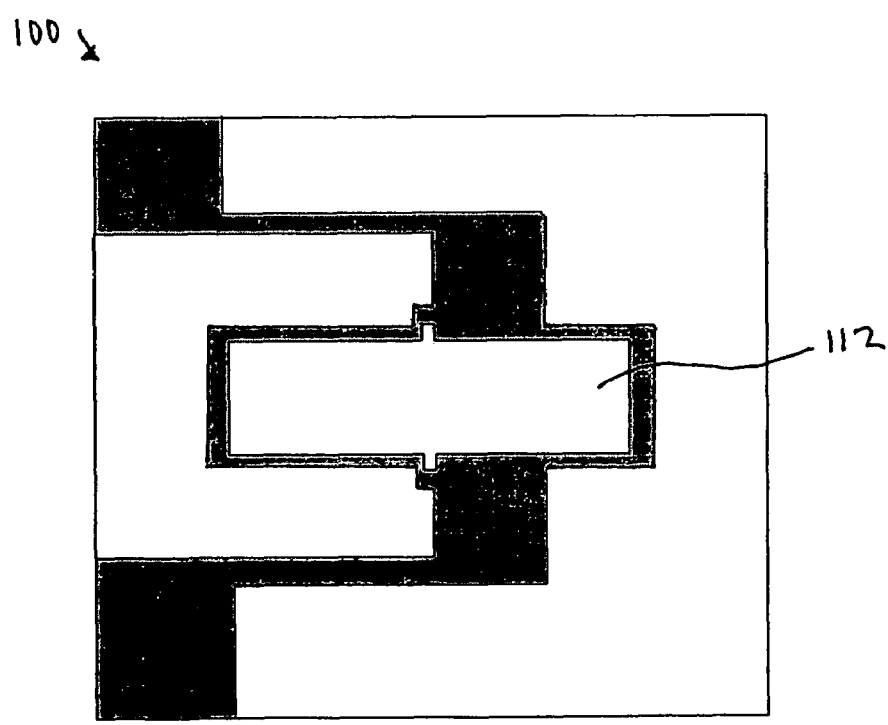
FIG. 1F shows an example implementation of the switch of FIGS. 1C and 1D, according to an embodiment of the present invention.

Relay 100 can be formed in any number of sizes, proportions, and configurations. FIGS. 1E and 1F show examples of relay 100, according to embodiments of the present invention. Note that the examples of relay 100 shown in FIGS. 1E and 1F are provided for purposes of illustration, and are not intended to limit the invention.

FIG. 1E shows an example relay 100 having a fixed end configuration, similar to the embodiment shown in FIGS. 1A and 1B. In the example of FIG. 1E, cantilever 112 has the dimensions of 700 μm×300 μm×30 μm. A thickness of cantilever 112 is 5 μm. Air gap 116 (not shown in FIG. 1E) has a spacing of 12 μm under cantilever 112. An associated coil 114 (not shown in FIG. 1E) has 20 turns.

FIG. 1F shows an example relay 100 having a hinge structure, similarly to the embodiment shown in FIGS. 1C and 1D. In the example of FIG. 1F, cantilever 112 has the dimensions of 800 μm×200 μm×25 μm. A pair of torsion flexures (not shown in FIG. 1F) are located in the center of cantilever 112 to provide the hinge function. Each flexure has dimensions of 280 μm×20 μm×3 μm. Air gap 116 (not shown in FIG. 1F) has a spacing of 12 μm under cantilever 112. An associated coil 114 (not shown in FIG. 1F) has 20 turns.

Principle of Operation of a Micro-Magnetic Latching Switch

When it is in the "down" position, the cantilever makes electrical contact with the bottom conductor, and the switch is "ON" (also called the "closed" state). When the contact end is "up", the switch is "OFF" (also called the "open" state). These two stable states produce the switching function by the moveable cantilever element. The permanent magnet holds the cantilever in either the "up" or the "down" position after switching, making the device a latching relay. A current is passed through the coil (e.g., the coil is energized) only during a brief (temporary) period of time to transition between the two states.

(i) Method to Produce Bi-Stability

Figure 2:
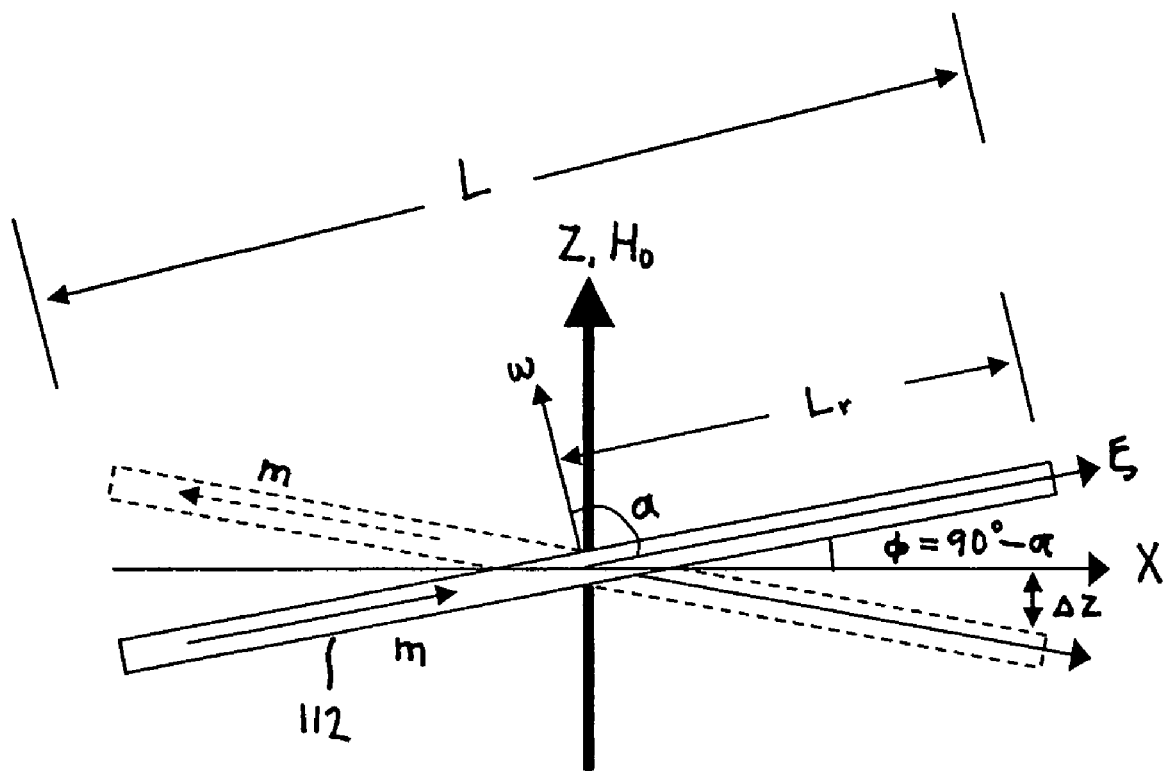
FIG. 2 illustrates the principle by which bi-stability is produced.

The principle by which bi-stability is produced is illustrated with reference to FIG. 2. When the length L of a permalloy cantilever 112 is much larger than its thickness t and width (w, not shown), the direction along its long axis L becomes the preferred direction for magnetization (also called the "easy axis"). When a major central portion of the cantilever is placed in a uniform permanent magnetic field, a torque is exerted on the cantilever. The torque can be either clockwise or counterclockwise, depending on the initial orientation of the cantilever with respect to the magnetic field. When the angle (∀) between the cantilever axis (>) and the external field ($H_0$) is smaller than 90E, the torque is counterclockwise; and when ∀ is larger than 90E, the torque is clockwise. The bi-directional torque arises because of the bi-directional magnetization (i.e., a magnetization vector "m" points one direction or the other direction, as shown in FIG. 2) of the cantilever (m points from left to right when ∀<90E, and from right to left when ∀>90E). Due to the torque, the cantilever tends to align with the external magnetic field ($H_0$). However, when a mechanical force (such as the elastic torque of the cantilever, a physical stopper, etc.) preempts to the total realignment with $H_0$, two stable positions ("up" and "down") are available, which forms the basis of latching in the switch.

(ii) Electrical Switching

If the bi-directional magnetization along the easy axis of the cantilever arising from $H_0$ can be momentarily reversed by applying a second magnetic field to overcome the influence of ($H_0$), then it is possible to achieve a switchable latching relay. This scenario is realized by situating a planar coil under or over the cantilever to produce the required temporary switching field. The planar coil geometry was chosen because it is relatively simple to fabricate, though other structures (such as a wrap-around, three dimensional type) are also possible. The magnetic field (Hcoil) lines generated by a short current pulse loop around the coil. It is mainly the >-component (along the cantilever, see FIG. 2) of this field that is used to reorient the magnetization (magnetization vector "m") in the cantilever. The direction of the coil current determines whether a positive or a negative >-field component is generated. Plural coils can be used. After switching, the permanent magnetic field holds the cantilever in this state until the next switching event is encountered. Since the >-component of the coil-generated field (Hcoil->) only needs to be momentarily larger than the >-component [$H_0$>~$H_0$ cos(∀)=$H_0$ sin(N), ∀=90E−N] of the permanent magnetic field and N is typically very small (e.g., N.5E), switching current and power can be very low, which is an important consideration in micro relay design.

The operation principle can be summarized as follows: A permalloy cantilever in a uniform (in practice, the field can be just approximately uniform) magnetic field can have a clockwise or a counterclockwise torque depending on the angle between its long axis (easy axis, L) and the field. Two bi-stable states are possible when other forces can balance die torque. A coil can generate a momentary magnetic field to switch the orientation of magnetization (vector m) along the cantilever and thus switch the cantilever between the two states.

Relaxed Alignment of Magnets

To address the issue of relaxing the magnet alignment requirement, the inventors have developed a technique to create perpendicular magnetic fields in a relatively large region around the cantilever. The invention is based on the fact that the magnetic field lines in a low permeability media (e.g., air) are basically perpendicular to the surface of a very high permeability material (e.g., materials that are easily magnetized, such as permalloy). When the cantilever is placed in proximity to such a surface and the cantilever's horizontal plane is parallel to the surface of the high permeability material, the above stated objectives can be at least partially achieved. The generic scheme is described below, followed by illustrative embodiments of the invention.

The boundary conditions for the magnetic flux density (B) and magnetic field (H) follow the following relationships:

$$B_2 \times n = B_1 \times n, \quad B_2 \times n = (\mu_2/\mu_1) B_1 \times n$$

or $$H_2 \times n = (\mu_2/\mu_1) H_1 \times n, \quad H_2 \times n = H_1 \times n$$

Figure 3:
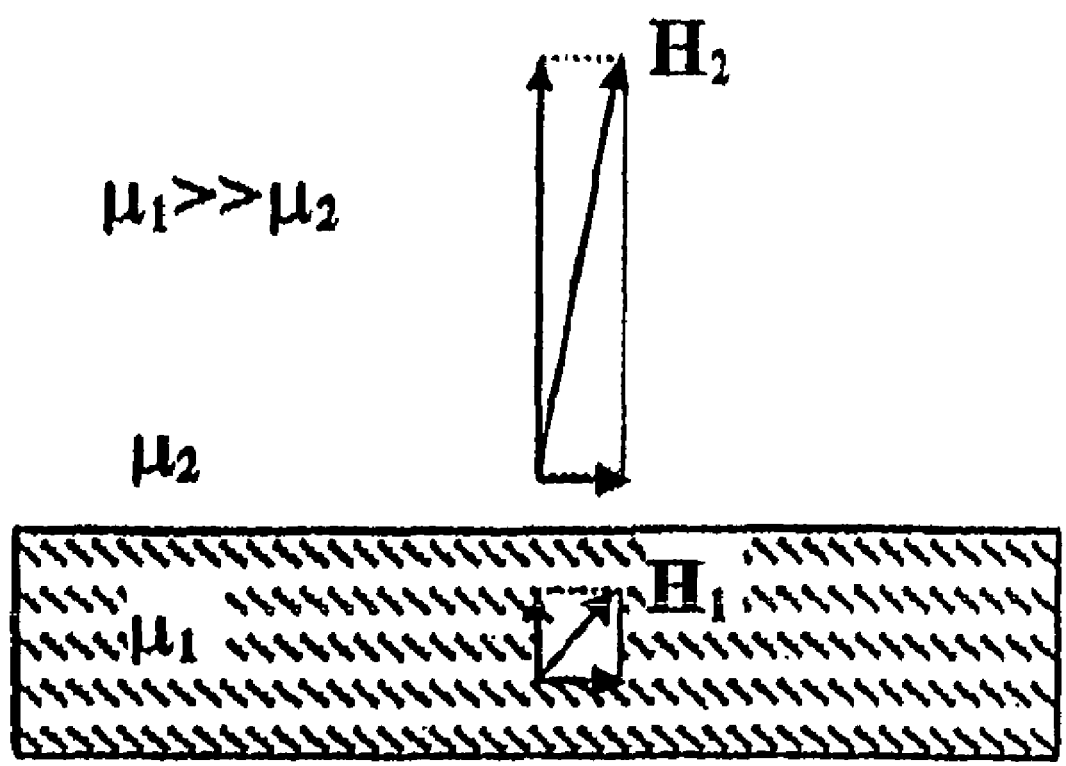
FIG. 3 illustrates the boundary conditions on the magnetic field (H) at a boundary between two materials with different permeability.

If $\mu_1 \gg \mu_2$, the normal component of H2 is much larger than the normal component of H1, as shown in FIG. 3. In the limit ($\mu_1/\mu_2$)□□, the magnetic field H2 is normal to the boundary surface, independent of the direction of H1 (barring the exceptional case of H1 exactly parallel to the interface). If the second media is air ($\mu_2$=1), then B2=$\mu_0$ H2, so that the flux lines B2 will also be perpendicular to the surface. This property is used to produce magnetic fields that are perpendicular to the horizontal plane of the cantilever in a micro-magnetic latching switch and to relax the permanent magnet alignment requirements.

This property, where the magnetic field is normal to the boundary surface of a high-permeability material, and the placement of the cantilever (i.e., soft magnetic) with its horizontal plane parallel to the surface of the high-permeability material, can be used in many different configurations to relax the permanent magnet alignment requirement.

The term "micro-magnetic switch" will hereafter be used to refer to either the latching or non-latching variety.

Embodiments for Testing Micro-Magnetic Switches

The micro-magnetic latching switches described above, and other types of micro-magnetic switches, can be formed on wafers in large numbers. The micro-magnetic switches can be latching and/or non-latching switches. According to embodiments of the present invention, the micro-magnetic latching switches are tested on the wafer. After testing, the switches can be separated from the wafer as needed.

Structural and operational implementations for testing micro-magnetic switches on a wafer according to the present invention are described in detail below. These embodiments are provided for illustrative purposes only, and are not limiting. Additional embodiments for testing micro-magnetic switches will become apparent to persons skilled in the relevant art(s) from the teachings herein.

Figure 4:
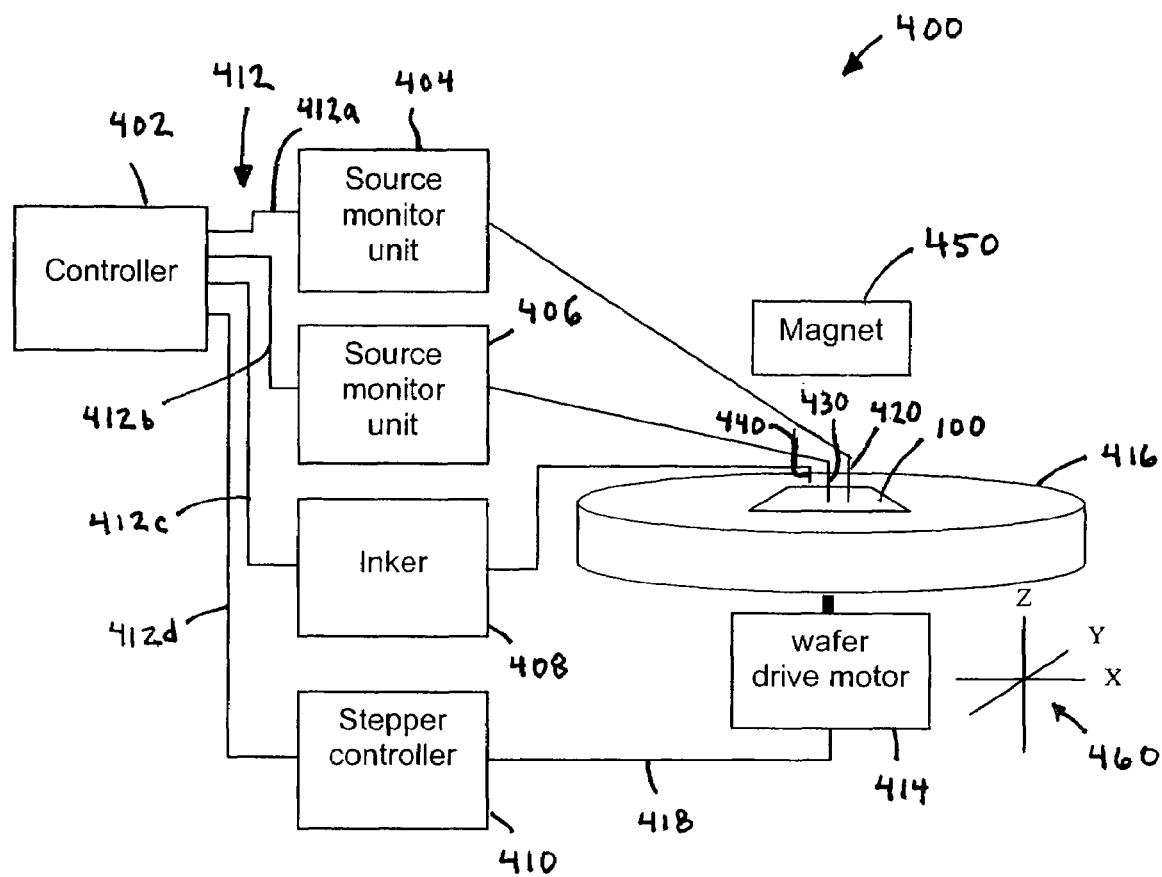
FIG. 4 illustrates a block diagram showing a wafer testing system configuration, according to an example embodiment of the present invention.

FIG. 4 shows an example wafer test configuration 400 for testing a plurality of switches 100 on the surface of a wafer 416, according to an embodiment of the present invention. Configuration 400 includes a controller 402, a current source 404, a switch state monitor 406, a failed switch marker 408, a stepper controller 410, a wafer drive motor 414, a first set of probes 420, a second set of probes 430, an inker probe 440, and a magnet 450. These components of configuration 400 are further described below.

Note that for illustrative purposes, configuration 400 is described below in terms of testing a switch 100. However, configuration 400 can be used to test other types of switches. Furthermore, a plurality of switches 100 are present on wafer 416 even though only a single switch 100 is shown on wafer 416 in FIG. 4, for illustrative purposes. Any number of switches 100 can be present on wafer 416, including tens, hundreds, thousands, and greater numbers. Switches 100 on wafer 416 can be of any type, including single pull-single throw (SPST), single pull-double throw (SPDT), double pull-double throw (DPDT), and/or other type of switch.

In the embodiment shown in FIG. 4, switch 100 on wafer 416 is actuated by a coil (not shown) that resides in wafer 416 adjacent to switch 100. The closely positioned coil is sufficiently close to the corresponding switch 100 so that it can actuate the switch when a sufficient current is applied thereto, as further described above. First set of probes 420 is used to provide the switching current to the closely positioned coil, and second set of probes 430 are used to determine whether the switch 100 is switching properly. Furthermore, during test, magnet 450 is positioned near the switch 100 to provide the necessary magnetic field for operation of the switch 100, as described above. Note that for alternative types of micro-magnetic switches under test, other techniques can be used to cause the switch to change states.

Controller 402 controls operation of wafer test configuration 400. Controller 402 can be any processor, multi-processor, computer system, or other controlling device or system. Controller 402 may include hardware, software, firmware, or any combination thereof, to perform its functions. Details of the operation of wafer test configuration 400, as controlled by controller 402, are provided below. Controller 402 is coupled to current source 404, switch state monitor 406, failed switch marker 408, and stepper controller 410, by respective signals 412a-412d. Signals 412a-412d can be individual signal lines, can be included in a bus, or can be segments of a single signal line 412. For example, a single signal line 412 can be a special-purpose or industry standard interface, such as an IEEE 488 interface, or other industry standard interface.

Current source 404 supplies a current to actuate the coil of switch 100 during testing. Current source 404 is electrically coupled to first set of probes 420, which interfaces with contacts of the coil of switch 100 on wafer 416. Current source 404 can be any device that can supply a sufficient current to actuate a coil of switch 100. For example, current source 404 can be any type of commercially available or special purpose voltage supply or current supply. In an embodiment, current source 404 can be a commercially available source monitor unit that can supply a current, such as manufactured by Agilent Technologies, Palo Alto, Calif., or other manufacturer of source monitor units. Current source 404 may couple with a single set of probes 420, or in an alternative embodiment, can couple to multiple sets of probes 420 for supplying current to coils of multiple switches 100 in parallel. Thus, current source 404 can be a single or multi-channel current supply or source monitor unit. Current source 400 supplies a current as directed by controller 402.

Switch state monitor 406 determines whether the switch 100 under test has properly switched into its first and second states as directed by the configuration 400. In an embodiment, switch state monitor 406 is electrically coupled to second set of probes 430. The second set of probes 430 interface with conductors/contacts of switch 100. The second set of probes 430 can determine whether, in an "ON" state, switch 100 provides an electrical connection between the electrical conductors/contacts, and when the switch 100 is off, whether an open circuit exists between the electrical conductors/contacts. Switch state monitor 406 can be any electrical equipment or device that is capable of providing this function. For example, switch state monitor 406 can be an Ohmmeter. In another example, switch state monitor can be a device that supplies a voltage or current to a first contact and can measure whether that voltage or current is present at the second contact when switch 100. Other types of devices are suitable for switch state monitor 406. For example, switch state monitor 406 can be a suitable source monitor unit as manufactured by Agilent Technologies, Palo Alto, Calif., or by another such manufacturer. Switch state monitor 406 can couple with a single second set of probes 430, or in an alternative embodiment, can couple to multiple second sets of probes 430 for monitoring multiple switches 100 in parallel. Thus, switch state monitor 406 can be a single or multi-channel device. Switch state monitor 406 is controlled by controller 402.

Failed switch marker 408 is used to provide an indication that a switch 100 has failed, as determined by switch state monitor 406. For example, failed switch marker 408 is coupled to inker probe 440, which marks a failed switch 100 with ink or other marking substance. Inker probe 440 can supply any type of substance to mark a failed or defective switch 100, including an ink, a gel, an acid, an epoxy, or any other type of substance. Failed switch marker 408 can be any commercially available device, or can be a specially designed device suitable for this purpose. For example, failed switch marker 408 can be an inker device as manufactured by Micromanipulator, Carson City, Nev., or any other manufacturer of inkers. Any number of one or more inker probes 440 can be coupled to failed switch marker 408 to mark failed switches. Failed switch marker 408 is directed by controller 402 to mark the defective switches 100 on wafer 416. In an alternative embodiment, other processes can be used to keep track of failed switches on wafer 416, and therefore, failed switch marker 408 may not be necessary. For example, in an embodiment, controller 402 can store the location and number of failed switches of wafer 416 in a memory device, so that this information can be used to later eliminate failed switches 100.

Stepper controller 410 receives signals from controller 402 to control the movement of wafer 416 during test. Wafer 416 is moved to interface probes 420 and 430, and magnet 450 with the various switches 100 under test. Stepper controller 410 provides a drive signal 418 to a wafer drive motor 414, which actually moves wafer 416. In embodiments, wafer drive motor 414 can move wafer 416 along one or more of the x-axis, y-axis, and z-axis, as indicated by axis 460. In the embodiment of FIG. 4, wafer 416 is moved by stepper controller 410, while probes 420, 430, 440, and magnet 450 remain in place. However, in an alternative embodiment, probes 420, 430, and 440, and magnet 450 could be moved, while wafer 416 remains in place. Stepper controller 410 and wafer drive motor 414 can be commercially available components, or may be special purpose devices. For example, stepper controller 410 and wafer drive motor 414 may be included in a available commercially probe station used to control movement of wafer 416, such as those manufactured by Electroglas, San Jose, Calif., or by any other such manufacturer.

Magnet 450 is positioned adjacent to wafer 416, close to a switch 100 that is being tested. Magnet 450 functions similarly to permanent magnet 102 as described above with respect to FIGS. 1A-1F, 2, and 3. Thus, during testing of a switch 100, magnet 450 provides magnetic field 134, as shown in FIGS. 1A and 1C, which enables operation of switch 100 described above. Magnet 450 can be any size or shape suitable for this purpose. Magnet 450 can be any type of magnet, including a permanent magnet or electromagnet. Furthermore, a plurality of magnets 450 can be present to test multiple switches 100 in parallel.

Figure 5:
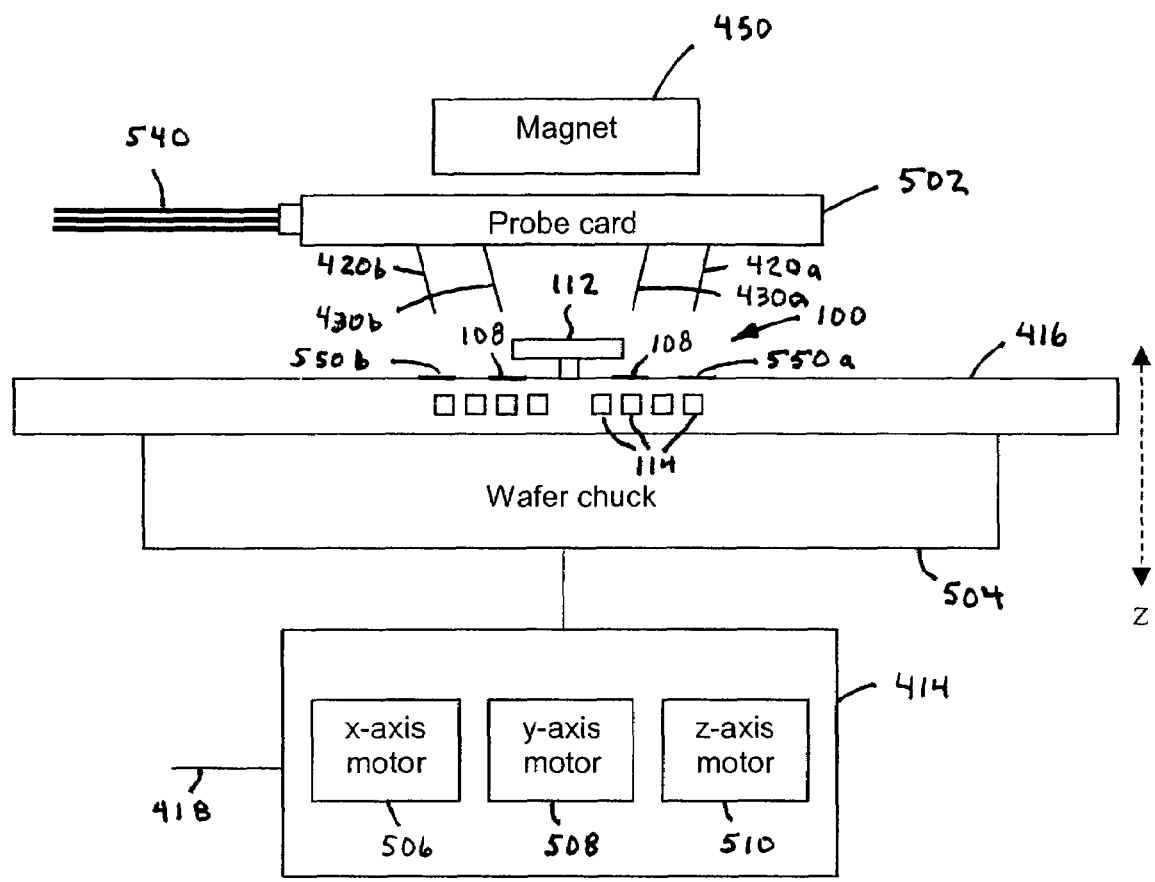
FIG. 5 illustrates additional detail of a portion of the wafer test configuration of FIG. 4, according to an example embodiment of the present invention.

FIG. 5 shows additional detail of a portion of configuration 400, according to an embodiment of the present invention. As shown in FIG. 5, wafer 416 is held by a wafer chuck 504. Wafer chuck 504 can be any type of applicable wafer chuck, either specially designed or commercially available. Wafer drive motor 414 is mechanically coupled to wafer chuck 504, and moves wafer 416 by moving wafer chuck 504. As shown in the example embodiment of FIG. 5, wafer drive motor 414 includes an x-axis motor 506, a y-axis motor 504, and a z-axis motor 510. Thus, wafer drive motor 414 is capable of moving wafer 416 in the three orthogonal axes. The motors of wafer drive motor 414 can be any type of applicable drive motors, either specially designed or commercially available. Alternatively, a more sophisticated six-degrees of freedom drive motor can be used.

Further detail of switch 100 is shown in FIG. 5, according to an embodiment of the present invention. As shown in FIG. 5, switch 100 includes a cantilever 112, a coil 114 embedded in wafer 416, a plurality of contacts 108, and first and second coil contacts 550a and 550b. Magnet 450 shown in FIG. 5 is positioned closely to switch 100 to provide the magnetic field necessary for operation of switch 100, as described above.

As shown in FIG. 5, in an embodiment, a probe card 502 is present to provide a mount for the various probes that interface with a switch 100. Probe card 502 mounts/holds first set of probes 420a/420b and second set of probes 430a/430b. In an embodiment, probe card 502 also mounts/holds inker probe 440. In an alternative embodiment, probe card 502 does not mount/hold inker probe 440. Probe card 502 is coupled to current source 404 and switch state monitor 406 via probe card cable 540. As shown in FIG. 5, first set of probes 420a/420b are aligned over coil contacts 550a/550b. Furthermore, second set of probes 430a/430b are aligned over switch contacts 108a/108b. Thus, when wafer 416 is moved a sufficient distance along the z-axis towards probe card 502, the various probes of probe card 502 interface with the corresponding contacts of switch 100 on wafer 416. Once probe card 502 has interfaced the probes with the contacts of wafer 416, testing of switch 100 can begin.

Note that in an alternative embodiment, probe card 502 can be moved towards wafer 416 to interface with switch 100, rather than moving wafer 416 towards wafer 416.

In an embodiment, prior to the initiation of testing of switches on wafer 416, the initial positions of magnet 450 and probe card 502 relative to the first switch 100 are set. Magnet 450 and probe card 502 can be initially positioned simultaneously, or independently. Magnet 450 and/or probe card 502 can be initially positioned adjacent to the first switch 100 automatically or manually. In an automatic initial positioning embodiment, probe card 502 and/or magnet 450 can be positioned adjacent to the first switch 100 according to an optical and/or mechanical positioning mechanism, which may or may not be computer controlled, such as by controller 402. After the initial positions of magnet 450 and probe card 502 are set with reference to the first switch 100, movement of wafer 416 can be accurately controlled to position further switches 100 adjacent to magnet 450 and probe card 502 without having to further adjust the positions of magnet 450 and probe card 502.

Figure 6:
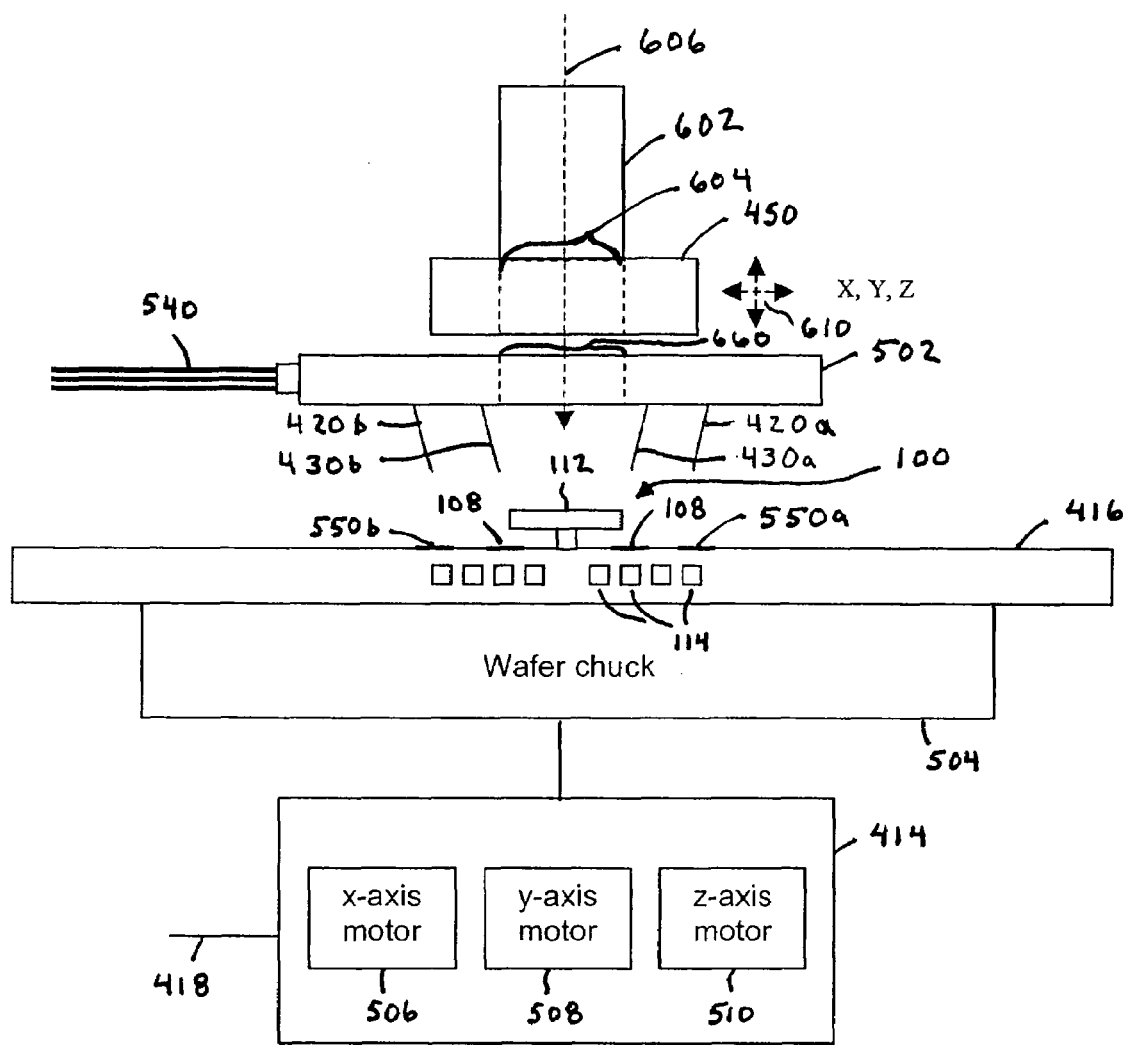
FIG. 6 illustrates the wafer test configuration portion of FIG. 5, with further detail of the positioning of a magnet and a probe card, according to an example embodiment of the present invention.

For example, FIG. 6 shows magnet 450 coupled to an optical device 602 that can be used for initial positioning of magnet 450. Magnet 450 can be mounted adjacent to optical device 602. In an embodiment, magnet 450 has a centrally located opening 604, so that magnet 450 can be mounted around the front end of optical device 602. Thus, for example, a user or computer "machine vision" system may view the first switch 100 using optical device 602, through opening 604 in magnet 450 and an opening 660 in probe card 502, to position magnet 450 relative to switch 100. For example, optical device 602 can be a microscope through which a user views the first switch 100. Magnet 450 is moved when optical device 602 is adjusted in the x-, y-, and/or z-axes, until magnet 450 is adequately positioned over the first switch 100.

In embodiments, magnet 450 and probe card 502 can be moved in any or all of the x, y, and z axes (such as indicated by axes 610), in order to be positioned over the first switch 100. Once magnet 450 and/or probe card 502 are initially positioned, they can remain in the initial position through testing of wafer 416 while wafer 416 is moved relative to them.

Figure 7:
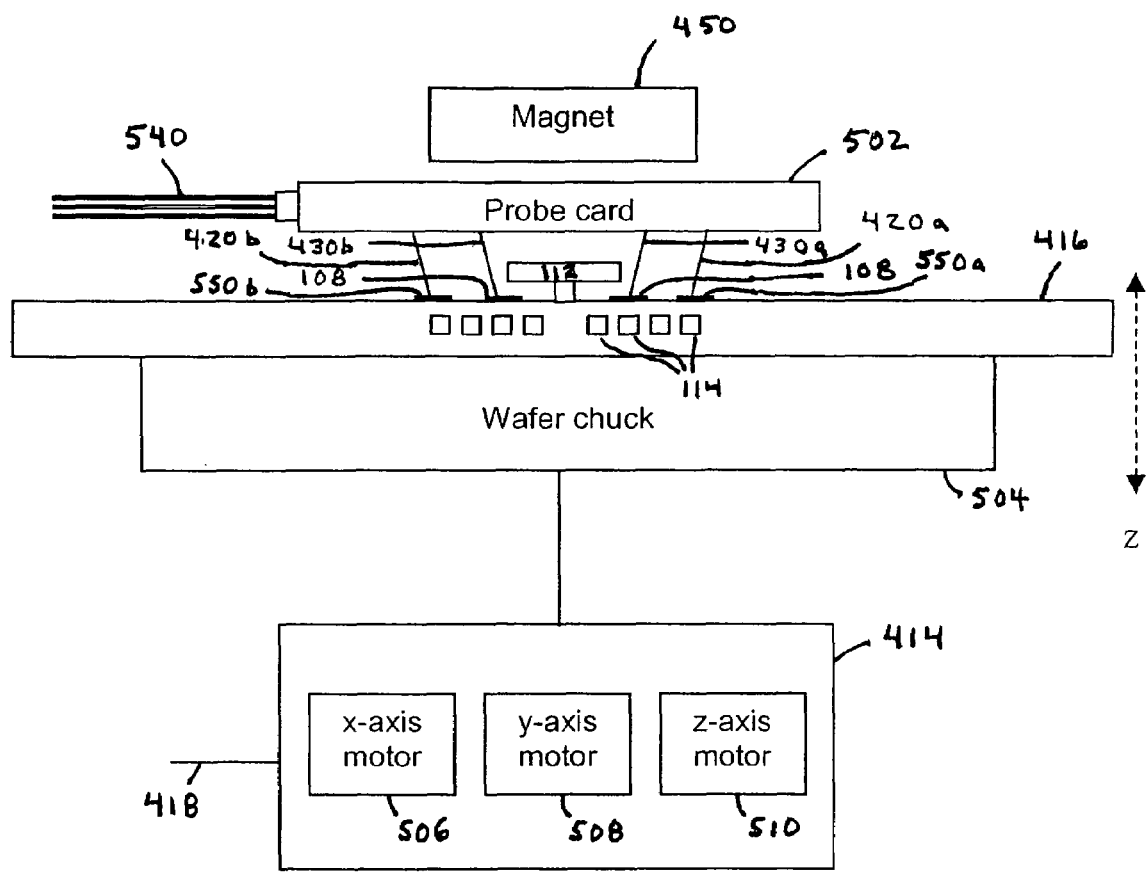
FIG. 7 illustrates the wafer test configuration portion of FIG. 5 with the probe card interfaced with a switch under test on the wafer, according to an example embodiment of the present invention.

FIG. 7 shows a switch 100 on wafer 416 undergoing test, according to an embodiment of the present invention. Relative to FIG. 5, wafer 416 has been moved along the z-axis so that contacts of switch 100 make contact with the probes of probe card 502, and so that magnet 450 is positioned to induce a magnetization in a magnetic material of cantilever 112. In this manner, operation of switch 100 can be tested, as further described below.

Figure 8:
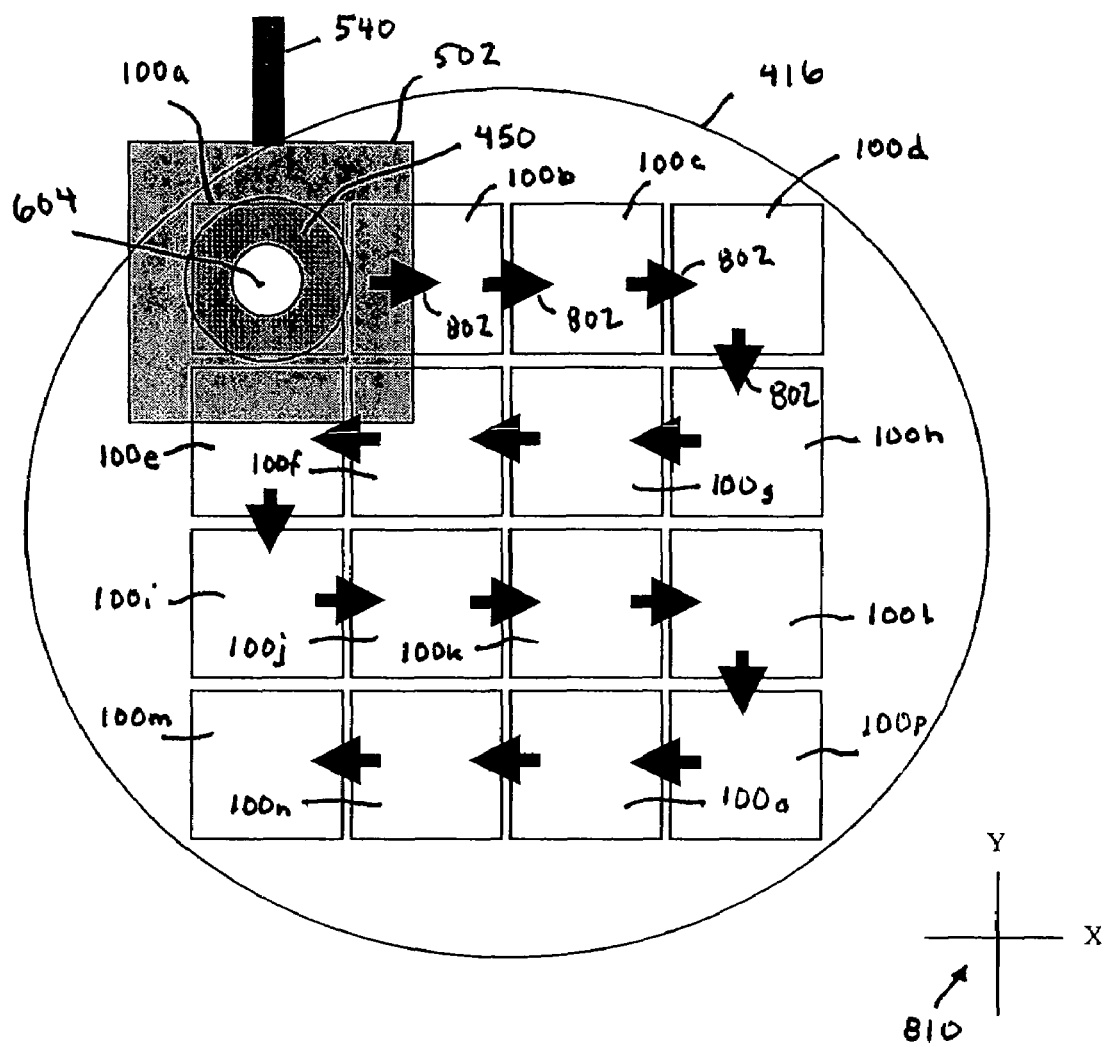
FIG. 8 shows a top view of a wafer having a plurality of switches thereon, and a probe card and magnet positioned adjacent to a first switch on the wafer, according to an example embodiment of the present invention.

Embodiments of the present invention test one or more switches of the plurality of switches 100 on a wafer 416. For example, FIG. 8 shows a plan view of an example wafer 416 having a plurality of switches 100a-100p formed thereon. Each of switches 100a-100p can be tested according to the present invention, one at a time, or more than one at a time, as further described below.

FIG. 8 a plan view of a wafer 416, and a portion of wafer test configuration 400. Probe card 502 and magnet 450 are shown positioned adjacent to first switch 100a. (Probe card 502 and magnet 450 are shown to be transparent for illustrative purposes). Thus, switch 100a may be tested using magnet 450 and probe card 502 as described herein. Once switch 100a has been tested, switch 100b may be tested. To accomplish this, wafer drive motor 414 first moves wafer 416 away from probe card 502 in the z-axis. Wafer drive motor 414 then moves wafer 416 along the x-axis (as indicated by axis 810) in a right-to-left direction relative to FIG. 8, so that probe card 502 and magnet 450 are positioned over second switch 100b. Then, wafer drive motor 414 moves wafer 416 along the z-axis towards probe card 502 and magnet 450 until the probes of probe card 502 interface with the contacts of second switch 100b. Magnet 450 induces a magnetization in the magnetic material of cantilever 112 (not shown) of second switch 100b. Switch 100b is thus tested. This process continues, until each of the switches of the plurality of switches 100a-100p on wafer 416 are tested. Note that switches 100a-100p can be tested in the order shown by arrows 802 in FIG. 8, or can be tested in a different order.

Figure 9:
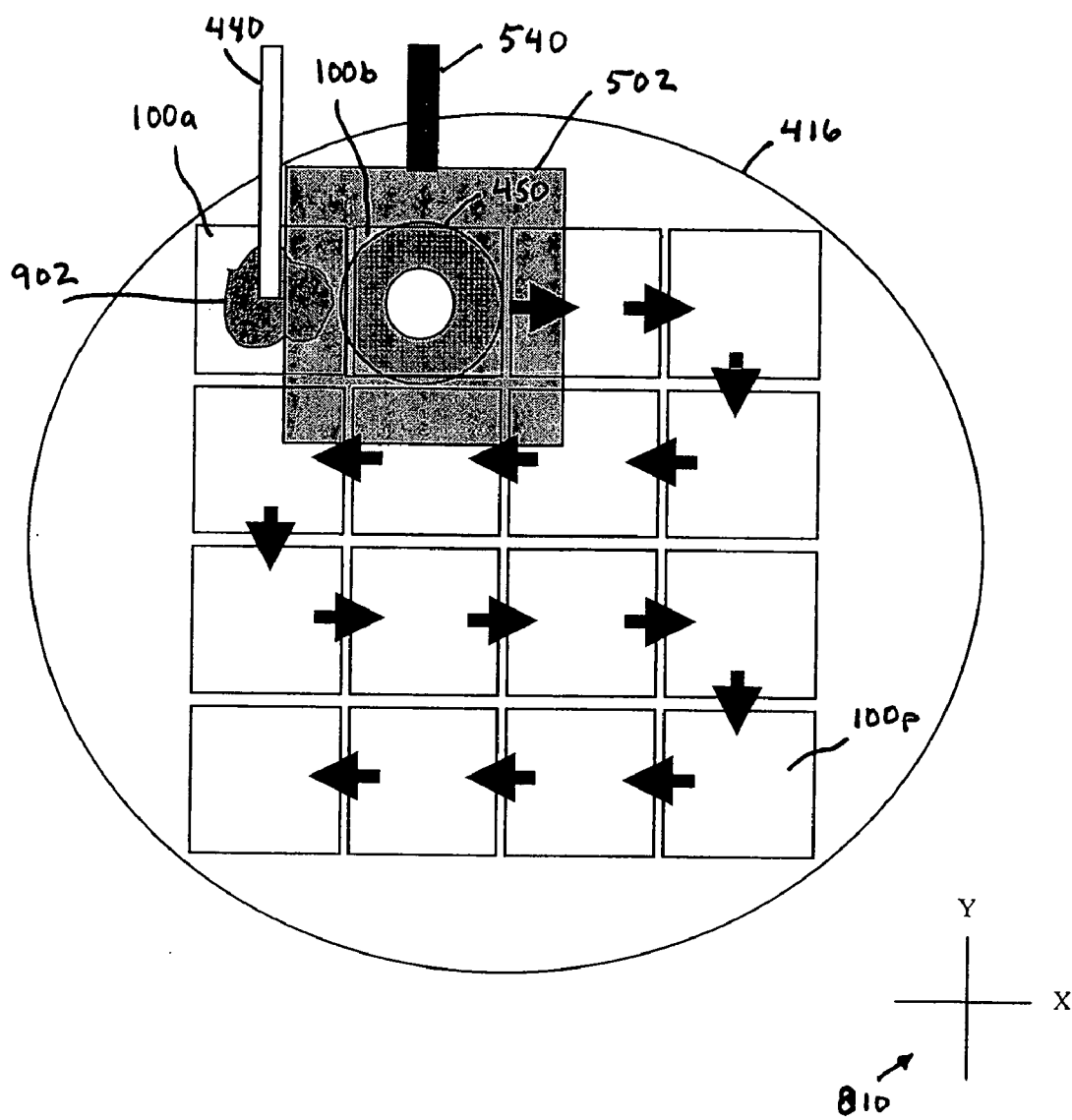
FIG. 9 shows a top view of a wafer having a plurality of switches thereon, a probe card and magnet positioned adjacent to a second switch of the plurality of switches, and an ink probe marking a first switch, according to an example embodiment of the present invention.

When a switch is determined to have failed, inker probe 440 (not shown in FIG. 8) is used to mark the failed switch. Inker probe 440 can be mounted in probe card 502, or, as shown in FIG. 9, inker probe 440 can follow behind probe card 502 and magnet 450. In such an embodiment, inker probe 440 can mark a failed previously tested switch 100 while probe card 502 and magnet 450 are testing a next switch 100. As shown in FIG. 9, inker 440 has marked a defective switch 100a with a mark 902. Mark 902 can be used later to locate failed or defective switches on wafer 416.

Figure 10:
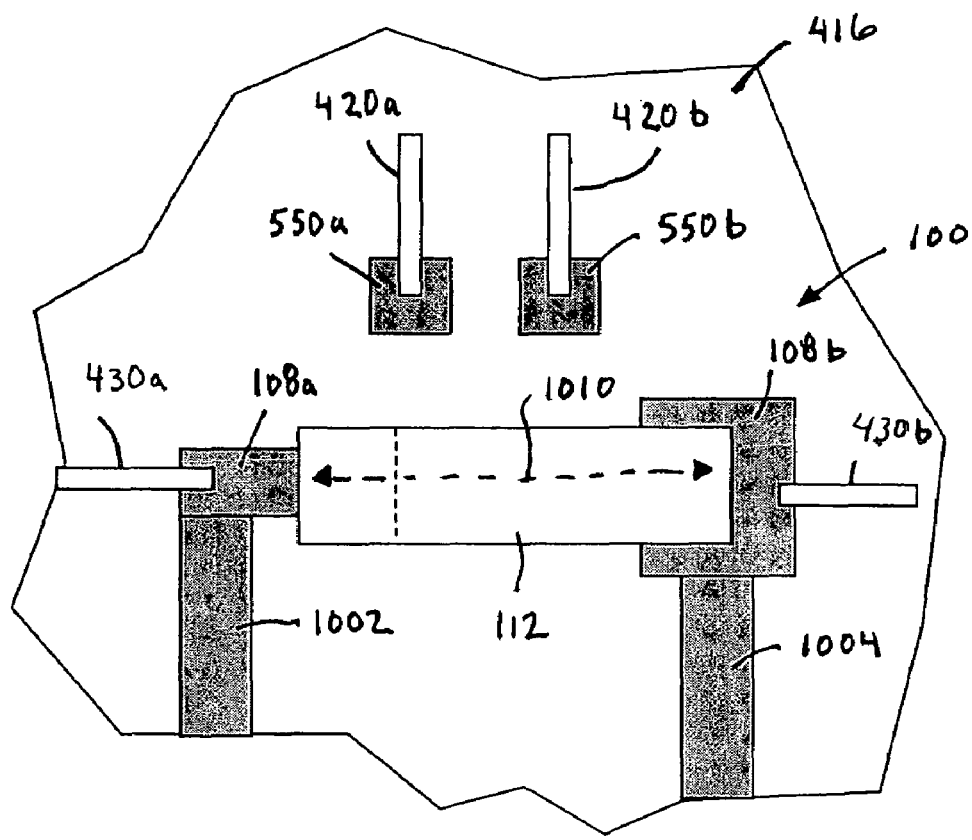
FIGS. 10, 12, and 13 show top views of switches under test on a wafer, according to example embodiments of the present invention.
Figure 11:
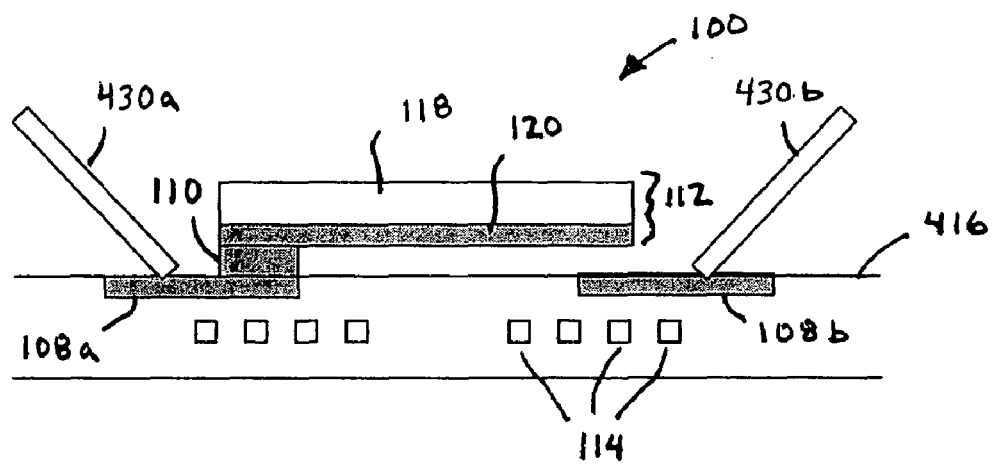
FIG. 11 shows a side cross-sectional view of the switch of FIG. 10, according to an example embodiment of the present invention.

FIG. 10 shows a portion of the surface of wafer 416, showing an example switch 100 under test. FIG. 11 shows a cross-sectional view of switch 100 of FIG. 10. As shown in FIGS. 10 and 11, probes 420a/420b and 430a/430b of wafer test configuration 400 interface with switch 100. As shown in FIG. 10, probe 420a is coupled to a first coil contact 550a, and a second probe 420b is coupled to a second coil contact 550b. Thus, current source 404 can provide a current to coil 114 (not shown) through first and second coil contacts 550a and 550b to actuate switch 100 when desired.

Furthermore, FIGS. 10 and 11 show a first probe 430a coupled to a first contact 108a, and a second probe 430b coupled to a second contact 108b. First and second probes 430a and 430b are used to determine whether cantilever 112 of switch 100 is properly opening and closing a connection between first and second contacts 108a and 108b. First and second contacts 108a and 108b are conductors related to switch 100, and can be separate contact areas or portions of conductive traces on the surface of wafer 416. First trace 1002 is an example conductive signal trace coupled to first contact 108a, and second trace 1004 is an example conductive signal trace coupled to second contact 108b.

In the embodiment shown in FIG. 10, cantilever 112 conducts electricity between contacts 108a and 108b (as shown by electrical path 1010) when switch 100 is in an "ON" state. In the "ON" state, the right end of cantilever 112 makes contact with second contact 108b. In the embodiment of FIG. 10, conducting layer 120 and staging layer 110 are electrically conductive, forming the electrical path through cantilever 112. When switch 100 is in an "OFF" state, cantilever 112 does not conduct electricity between contacts 108a and 108b, because the right end of cantilever 112 no longer makes contact with second contact 108b.

Switch state monitor 406 of FIG. 4 uses first and second probes 430a and 430b to determine when switch 100 is in a first state of a second state, by determining whether probes 430a and 430b are electrically coupled together by cantilever 112. For example, the first state for switch 100 can be an "OFF" state (such as is shown in FIG. 11). In an "OFF" state, cantilever 112 should not be electrically conductive between first and second contacts 108a and 108b. Thus, switch state monitor 406 determines whether first and second probes 430a and 430b are electrically coupled together. If they are not electrically coupled, then switch 100 is operating properly in the first state. If first and second probes 430a and 430b are electrically coupled together, then switch 100 is not operating properly in the first state, and switch 100 should be marked as failed by failed switch marker 408. As described above, switch state monitor 406 can use various methods for determining whether first and second probes 430a and 430b are electrically coupled together. Switch state monitor 406 can measure a resistance between first and second probes 430a and 430b (e.g., operate as an Ohmmeter), can supply a current or voltage to one of first and second probes 430a and 430b while detecting the current or voltage at the other of first and second probes 430a and 430b, or can use other methods to detect an open or short circuit.

After testing the first state of switch 100, switch 100 is caused to change states. For example, current source 404 provides a current through coil 114 using first and second probes 420a and 420b. When switch 100 is operating properly, cantilever 112 of switch 100 will change states during application of this current. Switch state monitor 406 can then determine whether switch 100 is properly in the second state. For example, if the second state is an "ON" state, cantilever 112 should be electrically conductive between first and second contacts 108a and 108b (as shown by conductive path 1010). If probes 430a and 430b are electrically coupled, then switch 100 is operating properly in the second state. If first and second probes 430a and 430b are not electrically coupled, then switch 100 is not operating properly in the second state, and should be marked as failed by failed switch marker 408.

In the discussion above, for illustrative purposes, the first state was described as an "OFF" state, and the second state was described as an "ON" state. Note that in the embodiments herein, however, the first state can be considered either an "ON" or "OFF" state, while the second state is considered the opposite "OFF" or "ON" state, respectively.

Figure 12:
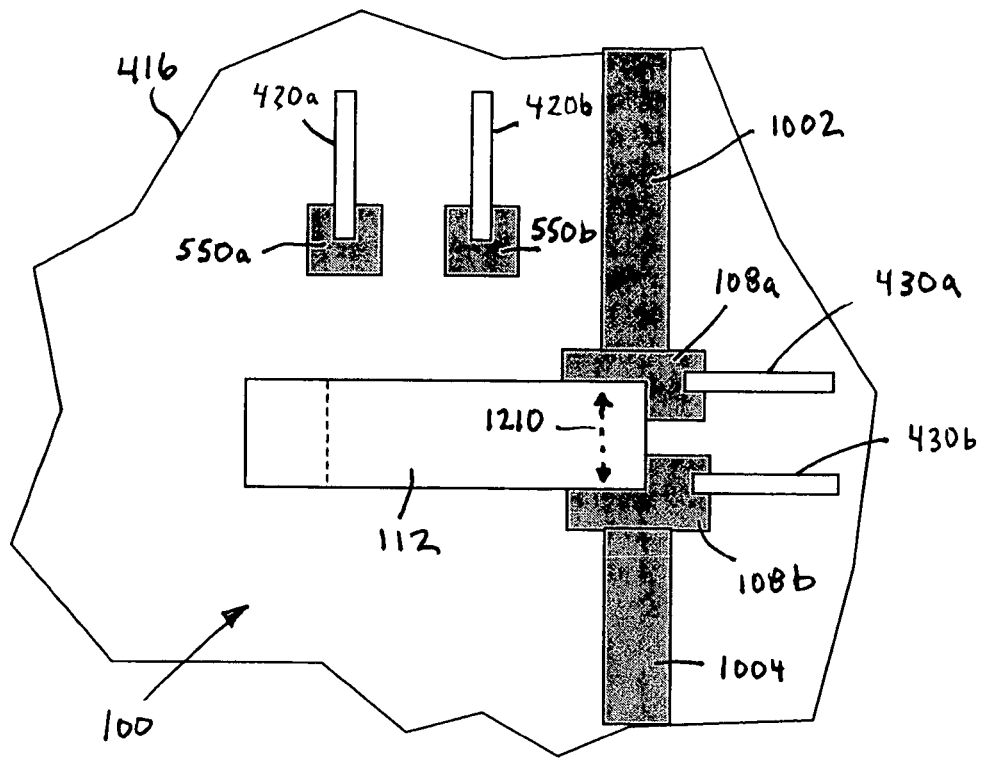

FIG. 12 shows a different type of switch under test, according to an example embodiment of the present invention. The switch 100 of FIG. 12 is substantially similar to switch 100 shown in FIGS. 10 and 11, except that cantilever 112 electrically couples first and second contacts 108a and 108b at its right end (as shown by electrical path 1210), instead of forming the connection along its entire length. Switch 100 of FIG. 12 is tested in a similar fashion as switch 100 shown in FIGS. 10 and 11.

Figure 13:
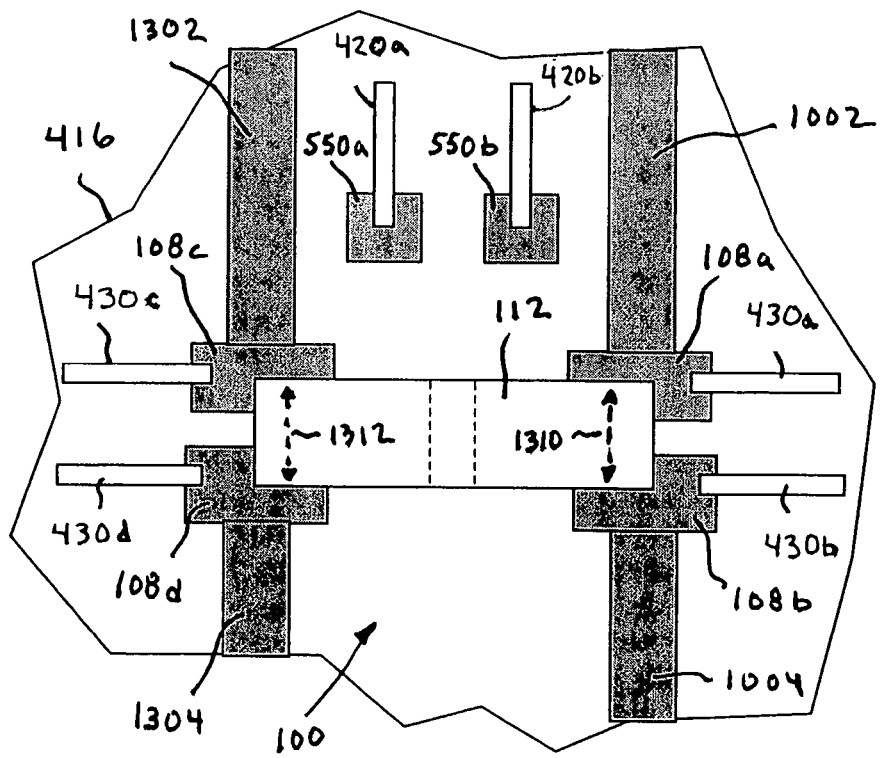

FIG. 13 shows another type of switch under test, according to an example embodiment of the present invention. As shown in FIG. 13, switch 100 is capable of making two electrical connections. For example, in a first state, the right end of switch 100 provides an electrical connection between first and second contacts 108a and 108b (as shown by electrical path 1310), while an open circuit is present between third and fourth contacts 108c and 108d. In a second state, the left end of switch 100 provides an electrical connection between third and fourth contacts 108c and 108d (as shown by electrical path 1312), while an open circuit is present between first and second contacts 108a and 108b. First and second probes 430a and 430b of the second set of probes interface with first and second contacts 108a and 108b, respectively. Third and fourth probes 430c and 430d of second set of probes 430 interface with third and fourth contacts 108c and 108d, respectively. First and second probes 430a and 430b are used to determine whether an electrical connection exists between first contact and second contact 108a and 108b during the first and second states of switch 100. Third and fourth probes 430c and 430d determine whether an electrical connection exists between third and fourth contacts 108c and 108d during the first and second states of switch 100. Current source 404 uses first and second probes 420a and 420b to provide a current to coil 114 to switch cantilever 112 between states.

Note that for the embodiments described herein, a switch 100 can be toggled between the first and second states, and tested in each state each time the switch 100 is toggled, as many times as desired.

Embodiments for Testing Switches on a Wafer in Parallel

Figure 14:
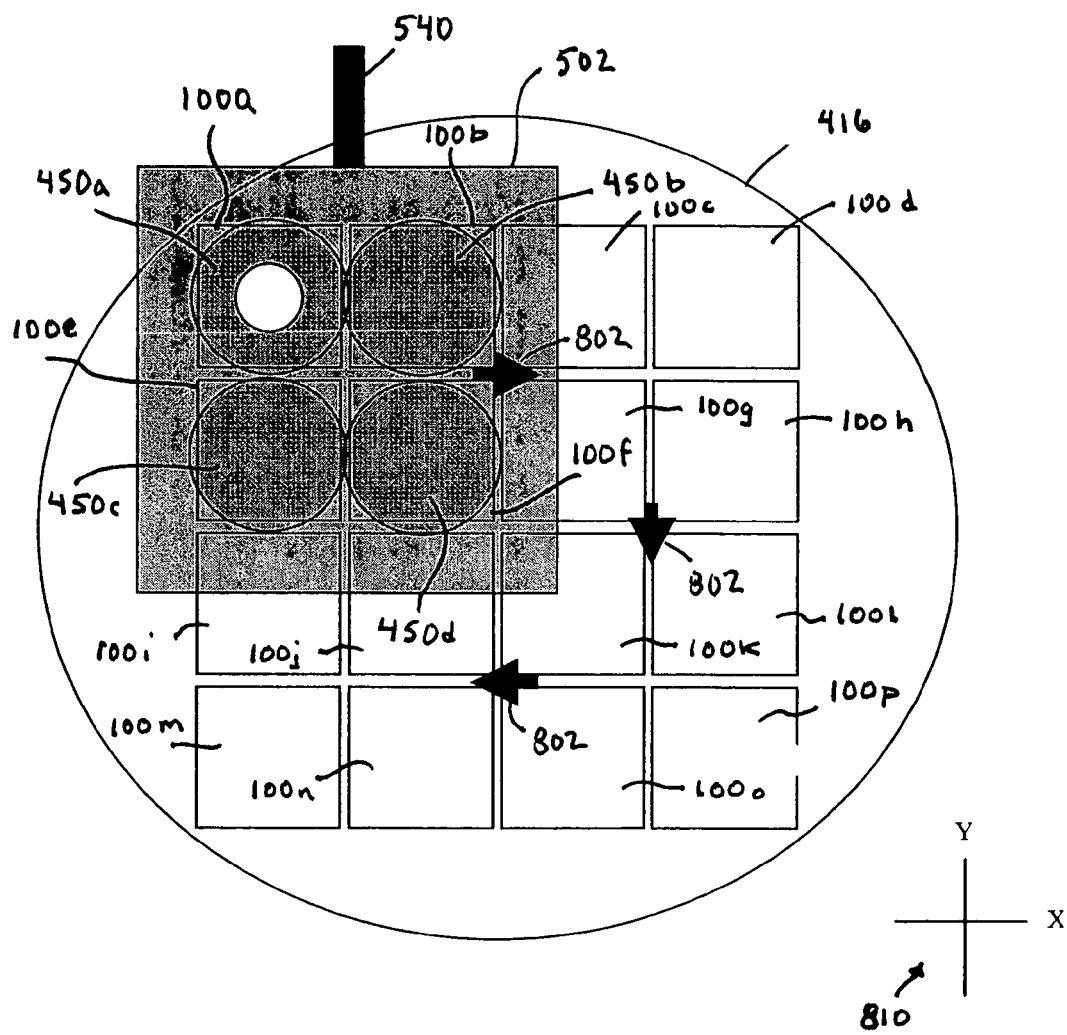
FIG. 14 shows a top view of a wafer having a plurality of switches thereon, and four magnets and a probe card positioned adjacent to four of the switches, according to an example embodiment of the present invention.

According to further embodiments of the present invention, multiple switches can be tested in parallel. For example, FIG. 14 shows wafer 416, with a plurality of magnets 450 and a probe card 502 positioned adjacently thereto. Probe card 502 of FIG. 14 includes a plurality of first sets of probes 420a/420b and a plurality of second sets of probes 430 (not shown in FIG. 14) for interfacing with a plurality of switches 100 simultaneously. Furthermore, the plurality of magnets 450 are each positioned adjacent to a corresponding switch 100. The example of FIG. 14 is configured to test four switches 100 on wafer 416 in parallel. Note that in other embodiments of the present invention, fewer or greater numbers of switches 100 may be tested simultaneously.

As shown in FIG. 14, magnets 450a-d are positioned closely adjacent to corresponding switches 100a, 100b, 100e, and 100f. Furthermore, probe card 502 has four first sets of probes 520 and four second sets of probes 530 (not shown) that interface with switches 100a, 100b, 101e, and 10f. After the first four switches 100 are tested, a second group of four switches 100 may be tested. Wafer 416 can be moved so that magnets 450a-d and probe card 502 are positioned over the second group of four switches 100. For example, the second set of switches 100 that can be tested are switches 100c, 100d, 100g, and 100h. Subsequent groups of four switches 100 can then be tested. In this manner, wafer 416 could be tested more rapidly by a factor of four, or by other factors, depending on the number of magnets 540 and of sets of probes of probe card 502 that are present.

Example Process Embodiments for Testing Micro-Magnetic Switches

Figure 15A:
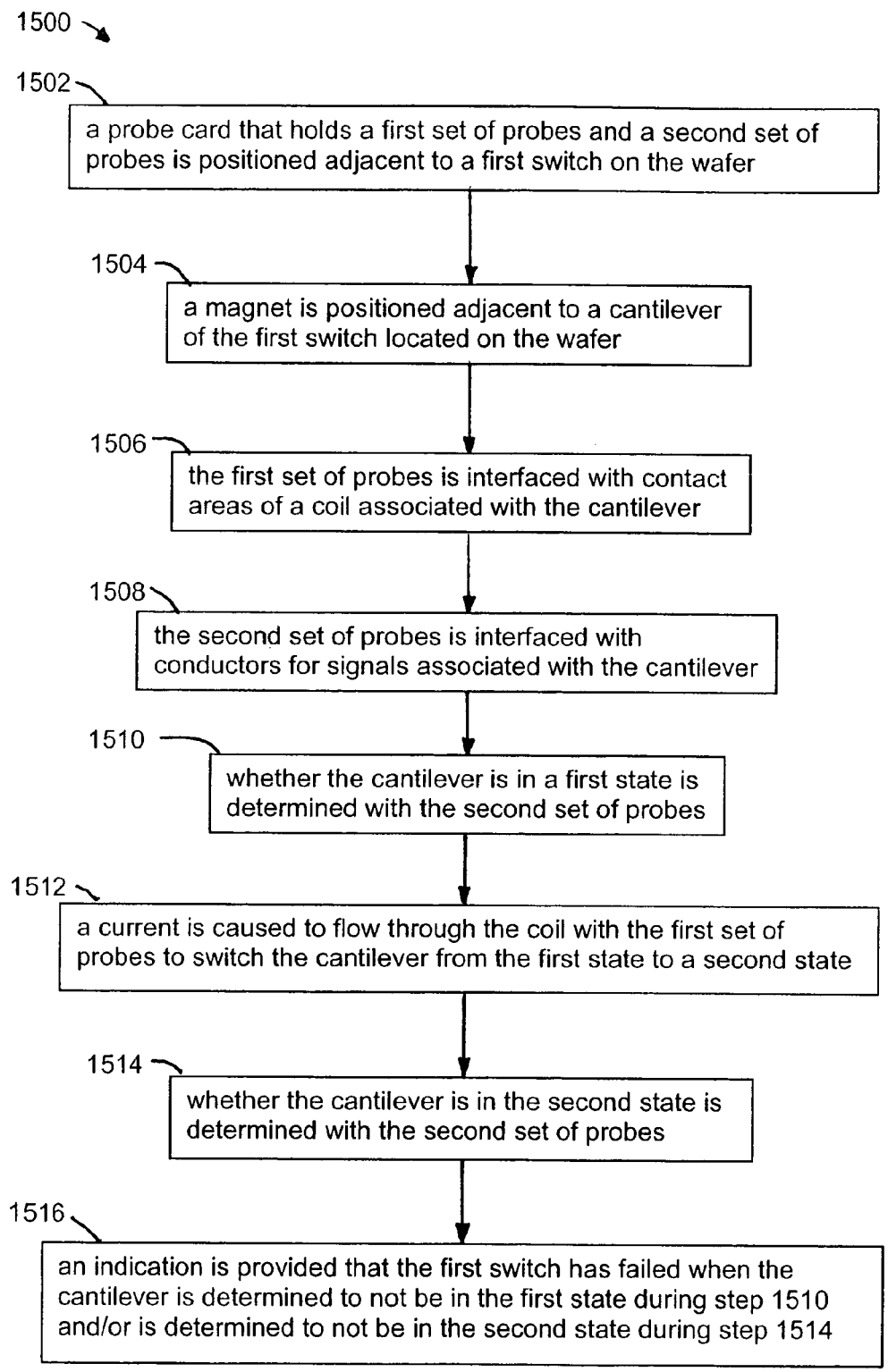

FIGS. 15A and 15B show a flowchart 1500 providing steps for testing a plurality of micro-magnetic switches on a wafer, according to an example embodiment of the present invention. The steps of FIGS. 15A and 15B do not necessarily have to occur in the order shown, as will be apparent to persons skilled in the relevant art(s) based on the teachings herein. Some steps of flowchart 1500 are optional. Other structural and operational embodiments will be apparent to persons skilled in the relevant art(s) based on the following discussion. These steps are described in detail below. Note that in the example described below, each of the switches tested includes a cantilever on the wafer and a coil imbedded in the wafer. However, the invention is not limited to this configuration.

Flowchart 1500 begins with step 1502. In step 1502, a probe card that holds a first set of probes and a second set of probes is positioned adjacent to a first switch on the wafer. For example, in an embodiment the probe card is probe card 502, as shown in FIG. 5. As shown in FIG. 5, probe card 502 holds a first set of probes 420a/420b and a second set of probes 430a/430b. As described above, probe card 502 is positioned above wafer 416 so that it is closely located to a particular switch 100 under test. Probe card 502 is positioned adjacent to a switch 100 so that probes 420a/420b and 430a/430b can interface with contacts of the switch 100 when probe card 502 and wafer 416 are interfaced. As described above, probe card 502 may be positioned either manually or automatically, and may be positioned optically, mechanically, visually, or otherwise.

Note that in some embodiments, a probe card is not used, and therefore step 1502 may not be necessary.

In step 1504, a magnet is positioned adjacent to a cantilever of a first switch located on the wafer. For example, the magnet is magnet 450, which is positioned adjacent to cantilever 112 of switch 100 on wafer 416, as shown in FIG. 6. Magnet 450 is positioned adjacent to cantilever 112 such during test, a magnetization is induced in a magnetic material of the cantilever 112. In this way, switch 100 operates as described above. As described above, magnet 450 can be positioned manually or automatically, and can be positioned optically, mechanically, visually, or otherwise. As described above, magnet 450 can have a centrally-located opening 604, so that it may be mounted to an optical device 602 used to position magnet 450 with respect to the first switch 100. Once magnet 450 and probe card 502 are properly aligned or positioned adjacent to a first switch 100, they do not need to be aligned again, as wafer 416 is moved in a manner such that subsequent switches 100 under test are properly positioned with respect to probe card 502 and magnet 540. For example, in an embodiment, stepper controller 410 can precisely move wafer 416 to maintain the proper positioning relationship between magnet 450, probe card 502, and each switch 100 under test.

In step 1506, the first set of probes is interfaced with contact areas of a coil associated with the cantilever. For example, in an embodiment, the first set of probes is first set of probes 420a/420b, which interface with coil contacts 550a/550b of switch 100 on the surface of wafer 416. First set of probes 420a/420b interface with contact areas 550a/550b when wafer 416 is moved into contact with them.

In step 1508, the second set of probes is interfaced with conductors for signals associated with the cantilever. For example, in an embodiment, the second set of probes is second set of probes 430a/430b, which interface with contact areas or conductors 108a/108b of switch 100 on the surface of wafer 416. The second set of probes 430a/430b interface with contacts 108a/108b when wafer 416 is moved towards probe card 502 (or probe card 502 is moved toward wafer 416) until contact is made.

In step 1510, whether the cantilever is in a first state is determined with the second set of probes. As described above, in embodiments, cantilever 112 can be in either a first state or a second state. The first state can be an "ON" or "OFF" state, while the second state is the opposite off or "ON" state. As described above, switch state monitor 406 may measure a resistance, or supply and measure a current and/or a voltage between the second set of probes 430 to determine whether cantilever 112 is in the proper state. For example, in FIGS. 10 and 12, probes 430a and 430b determine whether an electrical connection has been formed therebetween by cantilever 112. In the embodiment of FIG. 13, first and second probes 430a and 430b determine whether an electrical connection is formed therebetween by cantilever 112 for right end of cantilever 112, and third and fourth probes 430c and 430d determine whether an electrical connection is formed therebetween by the left end of cantilever 112.

When the first state is an "ON" state, probes 430 determine whether an electrical connection is formed therebetween by cantilever 112. If the first state is an "OFF" state, first and second probes 430a and 430b determine whether there is an open circuit residing between them.

In step 1512, a current is caused to flow through the coil with the first set of probes to switch the cantilever from the first state to a second state. For example, in an embodiment, the current is supplied by current source 404. The current flows through coil 114 of switch 100 using first set of probes 420a and 420b. The current causes cantilever 112 to switch from the first state to the second state, when switch 100 is operating properly.

In step 1514, whether the cantilever is in the second state is determined with the second set of probes. Similarly to the description above for step 1510, second set of probes 430 are used to determine whether cantilever 112 is in the second state. If the second state is an "OFF" state, probes 430 will be used to determine whether there is an open circuit between them. If the second state is an "ON" state, probes 430 will determine whether there is an electrical connection formed between them. For example, in the case of FIG. 13, probes 430a and 430b will determine whether the right end of cantilever 112 is in an "ON" or an "OFF" state, while probes 430c and 430d will determine whether the left end of cantilever 112 is in the opposite state.

In step 1516, an indication is provided that the first switch has failed when the cantilever is determined to not be in the first state during step 1510 and/or is determined to not be in the second state during step 1514. For example, the indication is provided by failed switch marker 408. Failed switch marker 408 provides an indication that a switch has failed by causing inker probe 440 to mark the defective switch 100. Inker probe 440 marks the defective switch 100 with a mark 902, such as shown in FIG. 9. Other ways of marking or keeping track of defective switches are also within the scope and spirit of the present invention.

FIG. 15B shows additional steps for flowchart 1500, for testing further switches on wafer 416. In step 1518, the wafer is moved so that the magnet is positioned adjacent to a cantilever of another switch located on the wafer, and so that the probe card is positioned adjacent to the another switch. For example, in embodiments, additional switches after the first switch 100 on wafer 416 may be tested. Wafer 416 may be moved using wafer drive motor 414. For example, as shown in FIGS. 5-7, wafer drive motor 414 includes an x-axis motor 506, a y-axis motor 508 and a z-axis motor 510. Wafer drive motor 414 moves wafer 416 along the z-axis away from probe card 502 and magnet 450 to an disengage probes 420a/420b and 430a/430b from a prior switch 100. Wafer drive motor 414 then moves wafer 416 along the x- and/or y-axis to position the next switch 100 adjacent to magnet 540 and probe card 502. Wafer drive motor 414 moves wafer 416 along the z-axis to interface probes 420a/420b and 430a/430b with the contacts 108a/108b and 550a/550b of switch 100. Furthermore, in this manner, magnet 450 is positioned closely adjacent to the next switch 100 under test, to induce a magnetization in a magnetic material of cantilever 112 of the next switch 100.

In step 1520, steps 1506-1516 are repeated for the another switch. For example, these steps described above for testing a switch are performed on the second switch 100.

In step 1522, steps 1518 and 1520 are repeated for each switch of a plurality of switches on the wafer. For example, in an embodiment, wafer 416 may again be moved as in step 1518, to position further switches 100 adjacent to magnet 450 and probe card 502. Each switch 100 is tested when positioned adjacent to magnet 450 and probe card 502. In this manner, a plurality of switches 100 on wafer 416 may be tested, and marked for failure if needed.

Flowchart 1500 can also include steps for testing switches in parallel, as described above. Such steps would be apparent to persons skilled in the relevant art(s) from the teachings herein.

CONCLUSION

The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above. Finally, it should be emphasized that none of the elements or components described above are essential or critical to the practice of the invention, except as specifically noted herein.

What is claimed is:

1. A system for testing a plurality of micro-magnetic switches formed on a wafer, wherein each switch of the plurality of switches includes a cantilever and a coil, comprising:

a wafer chuck that holds a wafer;

at least one stepper motor that moves said wafer chuck to move the wafer;

a magnet proximate to the wafer that is positioned adjacent to a first switch of the plurality of switches;

a probe card proximate to the wafer that is positioned adjacent to the first switch, wherein the probe card mounts a first set of probes that interface with contact areas of a coil associated with the first switch, and a second set of probes that interface with conductors on the wafer associated with the cantilever of the first switch;

a current source electrically coupled to the first set of probes, wherein the current source activates the coil of the first switch using the first set of probes to switch the cantilever from a first state to a second state;

a source monitor unit electrically coupled to the second set of probes, wherein the source monitor unit determines whether the cantilever of the first switch is in the first state prior to the current source activating the coil of the first switch, and determines whether the cantilever is in the second state after the current source activates the coil of the first switch.

2. The system of claim 1, wherein said at least one stepper motor moves said wafer in a direction substantially perpendicular to a plane of said wafer to interface said first set of probes with the contact areas of the coil of the first switch, and to interface said second set of probes with the conductors on the wafer associated with the cantilever of the first switch;

wherein said magnet induces a magnetization in a magnetic material of the cantilever of the first switch.

3. The system of claim 2, wherein said at least one stepper motor moves said wafer in a second direction substantially perpendicular to the plane of said wafer to de-interface said first set of probes from the contact areas of the coil of the first switch, and to de-interface said second set of probes from the conductors associated with the cantilever of the first switch.

4. The system of claim 3, wherein said at least one stepper motor moves said wafer in the plane of said wafer such that said magnet and said probe card are positioned adjacent to a cantilever of a second switch on the wafer.

5. The system of claim 4, wherein said at least one stepper motor moves said wafer in the first direction substantially perpendicular to the plane of said wafer to interface said first set of probes with contact areas of a coil of the second switch, and to interface said second set of probes with conductors on the wafer associated with the cantilever of the second switch;

wherein said magnet induces a magnetization in a magnetic material of the cantilever of the second switch.

6. The system of claim 3, wherein said at least one stepper motor step-wise moves said wafer in the plane of said wafer such that said magnet and said probe card are positioned adjacent to a cantilever corresponding to each switch of the plurality of switches on the wafer, one switch of the plurality of switches at a time.

7. The system of claim 6, wherein said at least one stepper motor moves said wafer in the first direction substantially perpendicular to the plane of said wafer to interface said first set of probes with contact areas of a coil corresponding to a switch of the plurality of switches when positioned adjacently thereto, and to interface said second set of probes with conductors on the wafer for signals associated with the cantilever of the switch of the plurality of switches when positioned adjacently thereto;

wherein said magnet induces a magnetization in a magnetic material of the cantilever corresponding to the switch of the plurality of switches when positioned closely adjacent thereto.

8. The system of claim 1, further comprising:

an inker for marking a switch on the wafer that has been determined by said source monitor unit to be defective.

9. The system of claim 1, further comprising:

a controller electrically coupled to said at least one stepper motor, said current source, and said source monitor unit.

10. The system of claim 1, further comprising:

optics that positions said magnet adjacent to the cantilever of the first switch.

11. The system of claim 1, further comprising at least one additional magnet held in a fixed position relative to said first magnet, wherein said at least one additional magnet is positioned adjacent to at least one additional switch of the plurality of switches;

wherein said probe card further mounts:

at least one additional first set of probes that interfaces with contact areas of at least one additional coil associated with the at least one additional switch on the wafer, and at least one additional second set of probes that interfaces with conductors on the wafer associated with at least one additional cantilever of the at least one additional switch.

* * * * *